United States Patent
Jiang et al.

(10) Patent No.: US 12,376,310 B2
(45) Date of Patent: Jul. 29, 2025

(54) MEMORY CELL HAVING SOURCE OR DRAIN ELECTRODE WITH KINK PORTION, MEMORY ARRAY AND MANUFACTURING METHOD THEREOF

(71) Applicant: Taiwan Semiconductor Manufacturing Company, Ltd., Hsinchu (TW)

(72) Inventors: Yu-Wei Jiang, Hsinchu (TW); Tsuching Yang, Taipei (TW); Sheng-Chih Lai, Hsinchu County (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 318 days.

(21) Appl. No.: 17/832,673

(22) Filed: Jun. 5, 2022

(65) Prior Publication Data
US 2023/0397426 A1 Dec. 7, 2023

(51) Int. Cl.
*H10B 51/20* (2023.01)
*H10B 51/10* (2023.01)
*H10B 51/30* (2023.01)

(52) U.S. Cl.
CPC ............ *H10B 51/20* (2023.02); *H10B 51/10* (2023.02); *H10B 51/30* (2023.02)

(58) Field of Classification Search
CPC ........ H10B 51/00; H10B 51/10; H10B 51/20; H10B 51/30
See application file for complete search history.

(56) References Cited

U.S. PATENT DOCUMENTS

| | | | | |
|---|---|---|---|---|
| 2021/0074726 A1* | 3/2021 | Lue | ........................ | H10B 51/30 |
| 2021/0375919 A1* | 12/2021 | Wang | .................. | H01L 23/5226 |
| 2022/0399400 A1* | 12/2022 | Takashima | ............. | H10B 63/34 |
| 2023/0048842 A1* | 2/2023 | Lin | ........................ | H10B 51/20 |

FOREIGN PATENT DOCUMENTS

| | | | | |
|---|---|---|---|---|
| CN | 113594170 A | * | 11/2021 | ........ H01L 27/11565 |
| WO | WO-2017091338 A1 | * | 6/2017 | ......... G11C 11/5628 |
| WO | WO-2020086566 A1 | * | 4/2020 | ......... H01L 27/0688 |

* cited by examiner

*Primary Examiner* — Matthew E Warren
(74) *Attorney, Agent, or Firm* — JCIPRNET

(57) ABSTRACT

A 3D memory array including multiple memory cells and a method of manufacturing the same are provided. Each memory cell includes a first isolation structure, source and drain electrodes, a gate layer, a channel layer and a memory layer. The source and drain electrodes are disposed on opposite sides of the first isolation structure, and the source and drain electrodes comprise kink portions. The gate layer is disposed beside the source and drain electrodes and the first isolation structure. The channel layer is disposed between the gate layer and the source electrode, the first isolation structure and the drain electrode, and the channel layer extends between the source and drain electrodes and covers the kink portions of the source and drain electrodes. The memory layer is disposed between the gate layer and the channel layer and extends beside the gate layer and extends beyond the channel layer.

20 Claims, 20 Drawing Sheets

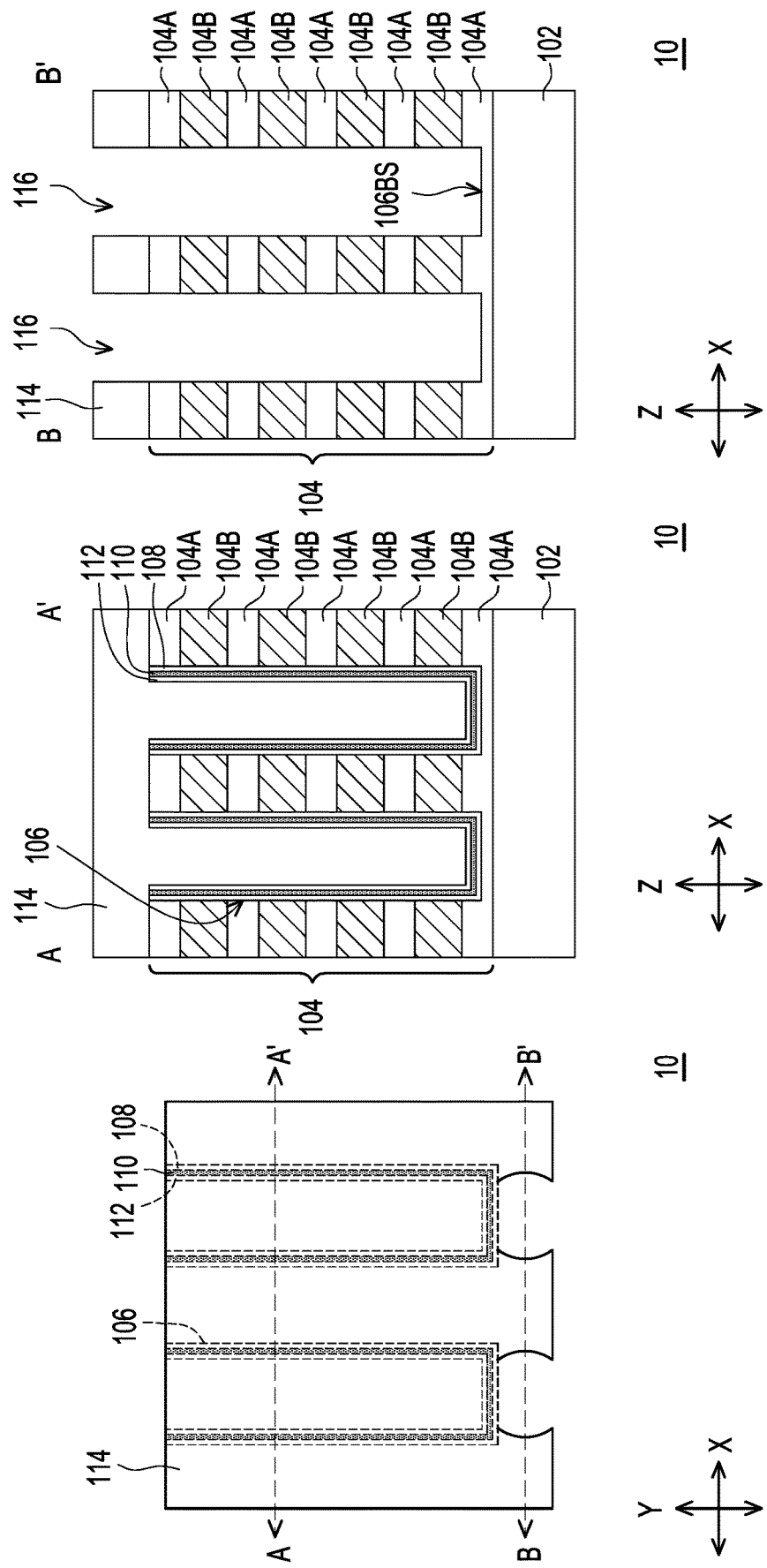

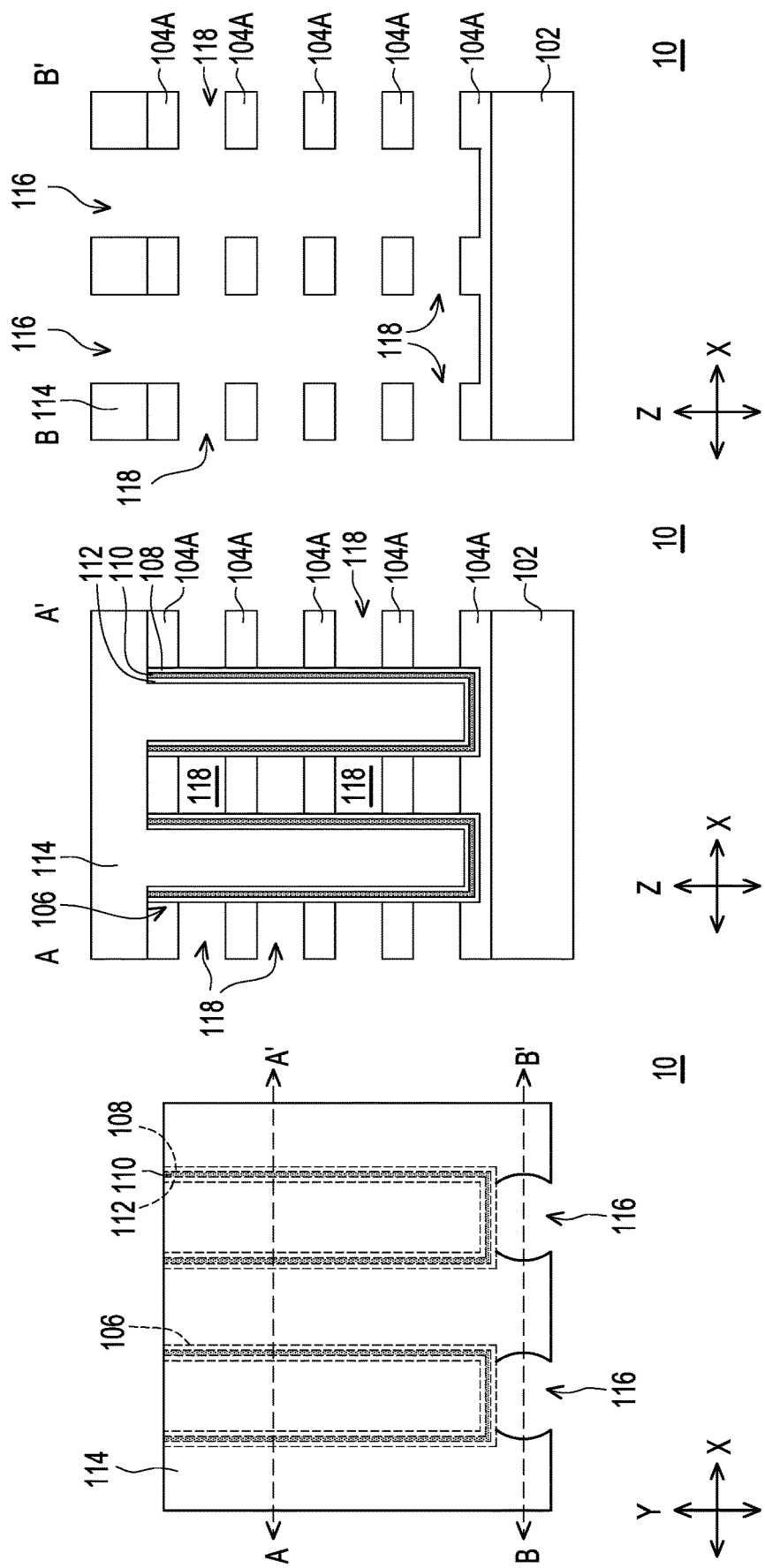

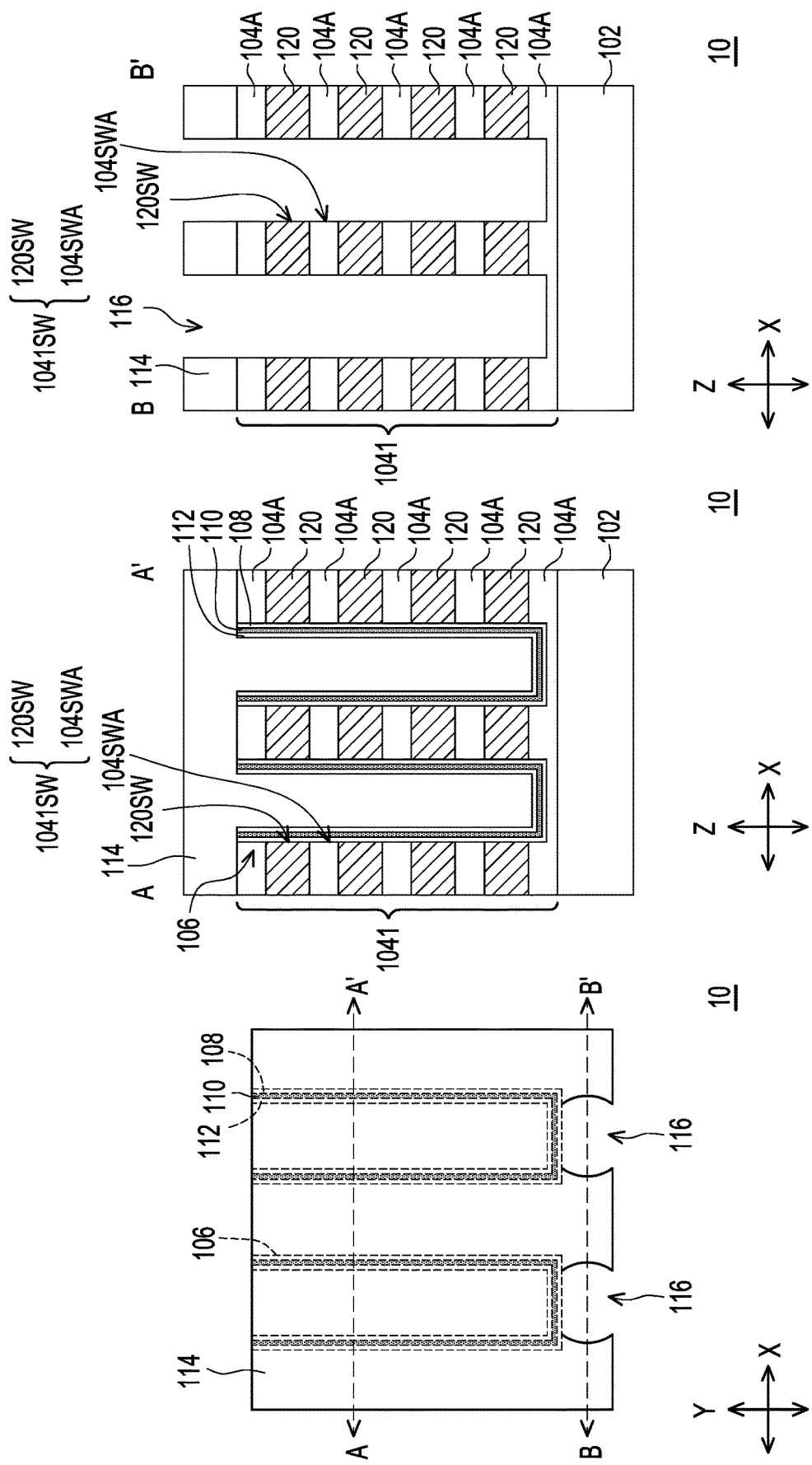

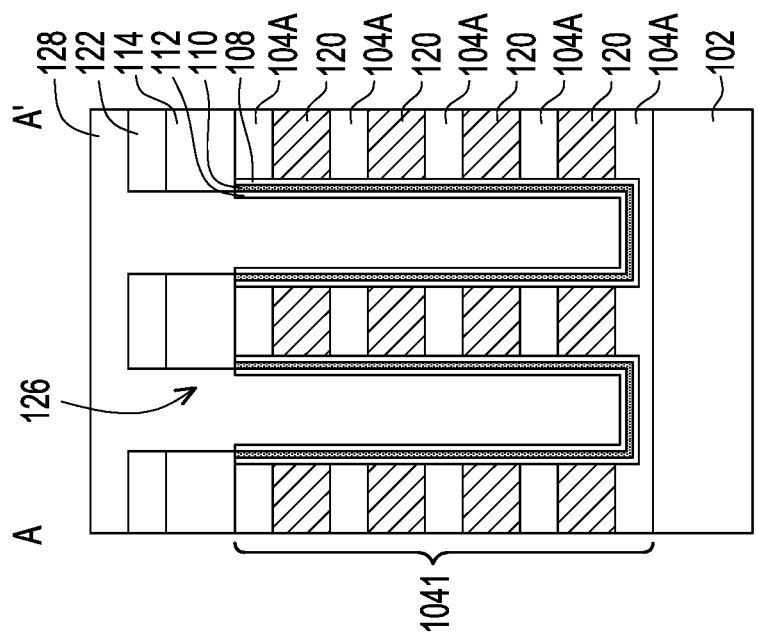
FIG. 10B
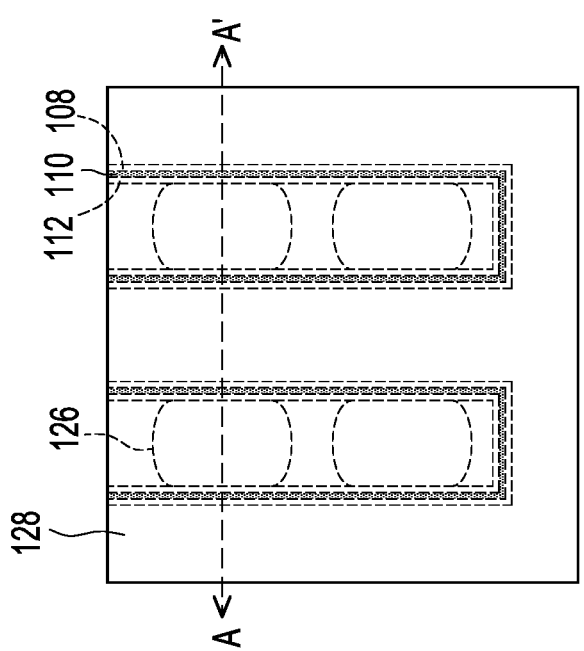
FIG. 10A

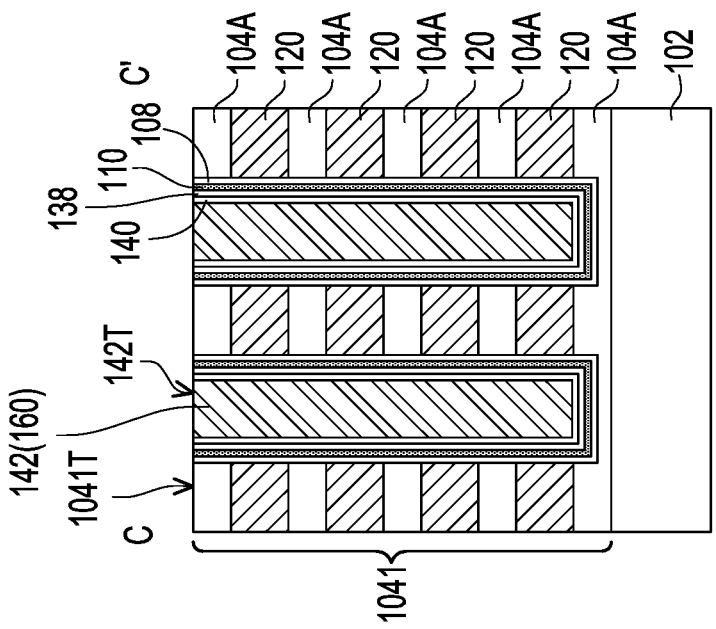
FIG. 18B
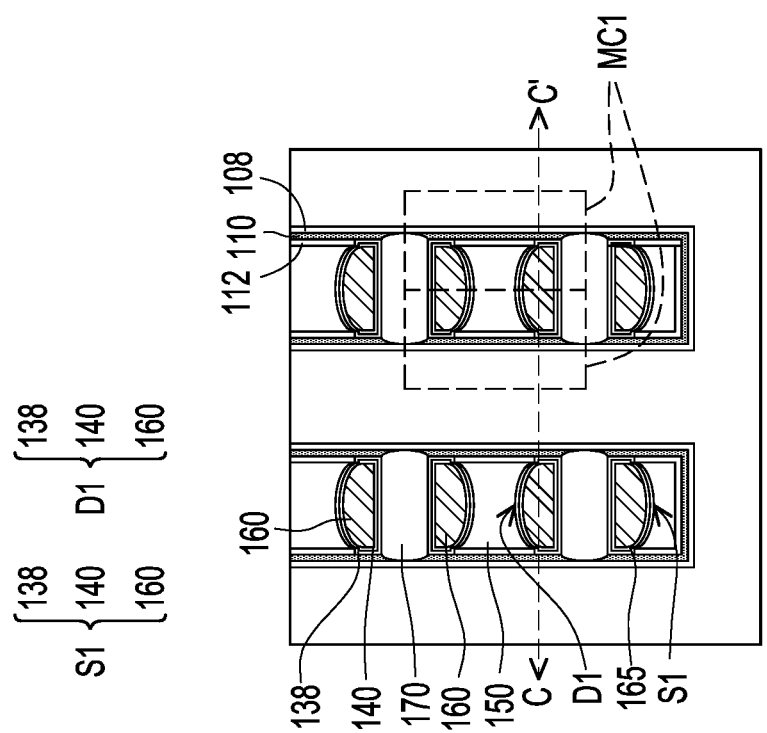
FIG. 18A

MEMORY CELL HAVING SOURCE OR DRAIN ELECTRODE WITH KINK PORTION, MEMORY ARRAY AND MANUFACTURING METHOD THEREOF

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include static random access memory (SRAM) and dynamic random access memory (DRAM). Non-volatile memories include ferroelectric random access memory (FeRAM, or FRAM).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 19A are schematic plan views showing a portion of a structure at various stages of a manufacturing method of a three-dimensional (3D) memory array in accordance with some embodiments of the disclosure.

FIG. 1B through FIG. 19B are schematic cross-sectional views of the structure respectively shown in FIG. 1A through FIG. 19A along different cross-sectional lines.

FIG. 2C through FIG. 7C and FIG. 12C through FIG. 14C are schematic cross-sectional views of the structure respectively shown in FIG. 2A through FIG. 7A and FIG. 12A through FIG. 14A along different cross-sectional lines.

DETAILED DESCRIPTION

Figure 1B:
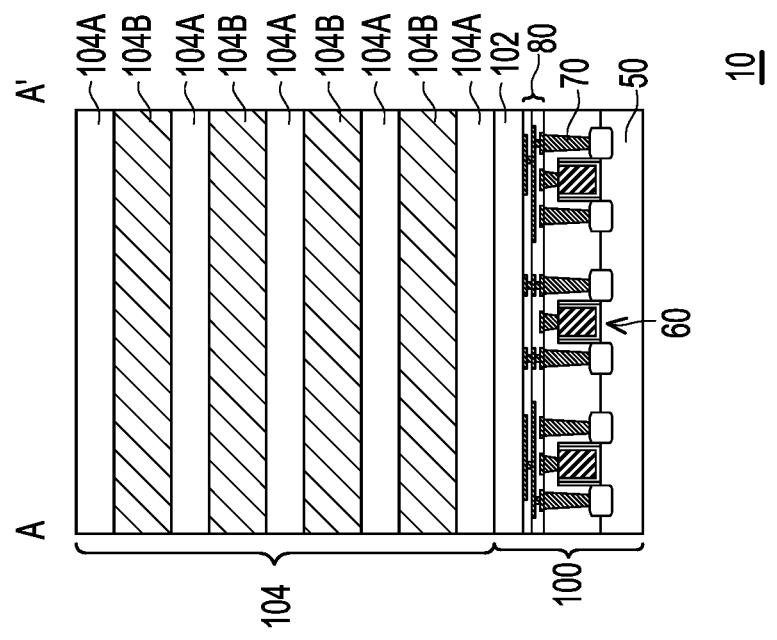

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Various embodiments provide a 3D memory array including a plurality of memory cells and a manufacturing method thereof. Each memory cell includes a transistor having a gate layer acting as a gate electrode, a first conductive pillar acting as a first source/drain electrode, and a second conductive pillar acting as a second source/drain electrode. Each transistor further includes a memory film as a gate dielectric layer and a semiconductor layer (e.g., an oxide semiconductor (OS) layer) as a channel layer. In accordance with some embodiments of the disclosure, each source electrode or drain electrode includes a kink portion (or, angled portion) that is laterally covered by the semiconductor layer.

In some embodiments, the manufacturing method of a 3D memory array includes forming first trench openings extending into the multilayered structure which includes conductive layers (functioned as gate electrodes) and dielectric layers in alternation, and a stack of a ferroelectric layer (functioned as gate dielectric layer), a semiconductor layer (functioned as channel layer) and a dielectric layer is conformally deposited within the first trench openings. Then multiple second trench openings are formed within each first trench opening. Each second trench opening can be further divided into two semi-trench openings by an isolation structure formed therein, and the capping layers located beside the semi-trench openings are selectively etched off to form two electrode though-holes. The electrode though-holes are further filled with conductive materials so as to form electrodes that are functioned as a corresponding source electrode and a corresponding drain electrode respectively for two adjacent memory cells. Through forming a single trench opening where two electrode through-holes separated by an isolation structure will be subsequently formed therein, the high aspect ratio etching process may be avoided and the process margin for high-density memory device may be increased.

With reference to FIGS. 1A-19A, 1B-19B, 2C-7C and 12C-14C, the formation of a 3D memory array 10 is described below.

Figure 1A:
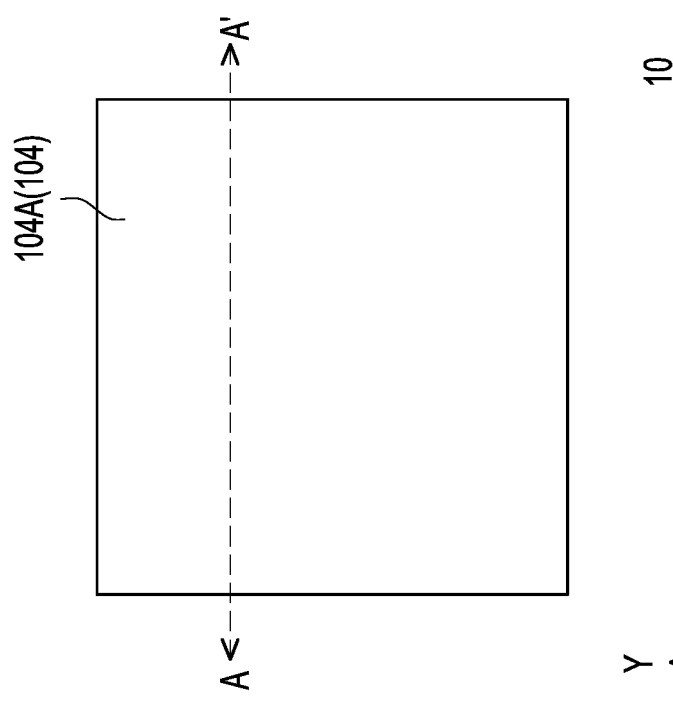

Referring to FIG. 1A and FIG. 1B, in some embodiments, a multilayered structure 104 is formed over a substrate layer 102, and the substrate layer 102 is located between the multilayered structure 104 and a semiconductor structure 100. In some embodiments, the semiconductor structure 100 includes a substrate 50 and devices 60 formed thereon. The substrate 50 may be a semiconductor substrate such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Other substrates, such as a multi-layered or gradient substrate may also be used. The devices 60 are formed over the substrate 50. In some embodiments, the devices 60 may be active devices or passive devices. For example, the devices include electrical components such as transistors, diodes, capacitors, resistors, which are formed by any suitable formation method.

As shown in FIG. 1B, an interconnect structure 80 is formed over the substrate 50 and electrically connected to the devices 60 through a plurality of conductive vias 70. In some embodiments, the interconnect structure 80 interconnects the devices 60 to form integrated circuits. The interconnect structure 80 includes multiple metallization layers, and each metallization layer includes metallization patterns (e.g., metal lines and metal vias) in an inter-metal dielectric (IMD) layer. The interconnect structure 80 may be formed by a damascene process, such as a single damascene process, a dual damascene process.

In some embodiments, the substrate layer 102 may include a dielectric material. For example, the substrate layer 102 includes a dielectric layer formed from oxides (e.g., silicon oxide), nitrides (e.g., silicon nitride), carbides (e.g., silicon carbide), silicon oxynitride, silicon oxycarbide, silicon carbonitride, or a combination thereof. In some embodiments, the substrate layer 102 is referred to as a substrate of the 3D memory array 10. In one embodiment, the substrate layer 102 may be used as an etching stop layer over the semiconductor structure 100 to prevent any undesired damages to devices that are formed within the semiconductor structure 100. It should be appreciated that the semiconductor structure 100 is omitted from the 3D memory array 10 in the following figures for clarity.

Still referring to FIG. 1A and FIG. 1B, in some embodiments, the multilayered structure 104 includes dielectric layers 104A and sacrificial layers 104B stacked in alternation. For example, the dielectric layers 104A and sacrificial layers 104B are alternatingly formed over the substrate layer 102 in sequence. In some embodiments, the materials of dielectric layers 104A and sacrificial layers 104B are different. For example, the dielectric layers 104A are formed from the same dielectric material, and the sacrificial layers 104B are formed from the same dielectric material, but the dielectric material of the dielectric layers 104A is different from the dielectric material of the sacrificial layers 104B. In some embodiments, the dielectric layers 104A are formed of an oxide material such as silicon oxide or silicon oxycarbide, and the sacrificial layers 104B are formed of silicon or a nitride material such as silicon nitride or titanium nitride. Other combinations of dielectric materials having acceptable etching selectivity from one another may also be used.

As illustrated in FIG. 1B, the multilayered structure 104 includes five layers of the dielectric layers 104A and four layers of the sacrificial layers 104B for illustrative purposes; however, the disclosure is not limited thereto. It is understood that the numbers of the layers of the dielectric layers 104A and the sacrificial layers 104B in the multilayered structure 104 may vary and be modified according to the layout of the device structure. In some embodiments, the dielectric layers 104A and the sacrificial layers 104B of the multilayered structure 104 are formed through one or more deposition processes, and the deposition processes include chemical vapor deposition (CVD) such as plasma-enhanced chemical vapor deposition (PECVD) or flowable chemical vapor deposition (FCVD), atomic layer deposition (ALD), or the like. In some embodiments, the dielectric layers 104A are formed with substantially the same thickness, the sacrificial layers 104B are formed with substantially the same thickness, but the dielectric layers 104A and the sacrificial layers 104B have different thicknesses. In alternative embodiments, the dielectric layers 104A and the sacrificial layers 104B are formed with substantially the same thickness.

Figures 2A, 2B, 2C:
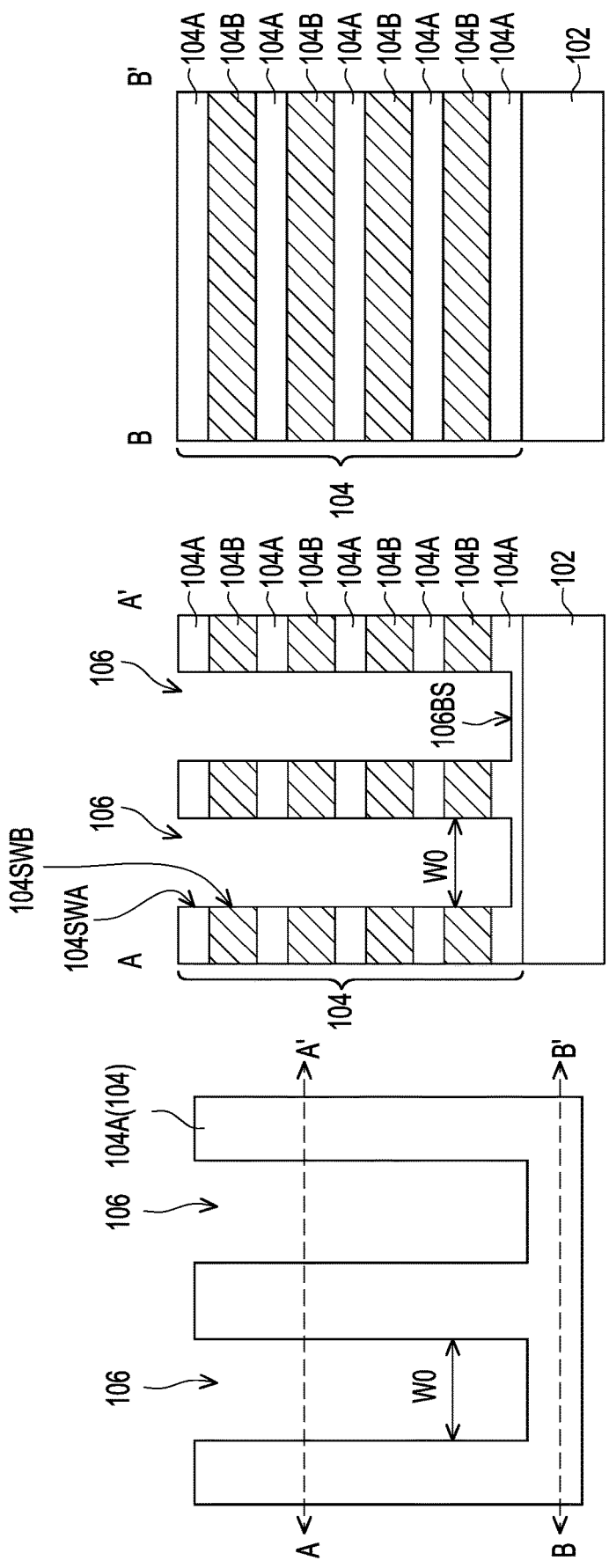

In some embodiments, as depicted in FIGS. 2A-2C, the multilayered structure 104 is patterned to form trench openings 106. In some embodiments, the trench openings 106 have a width W0 in the X direction. In some embodiments, the trench openings 106 formed in the multilayered structure 104 do not penetrate through the whole multilayered structure 104. That is, the substrate layer 102 is not exposed from the trench openings 106. In some embodiments, the patterning process includes at least one anisotropic etching process, and the dielectric materials of the dielectric layers 104A and the sacrificial layers 104B are chosen to have etching selectivity relative to the material of the substrate layer 102. For example, in embodiments where the substrate layer 102 includes the etching stop layer, the patterning process may stop at the substrate layer 102.

As shown in FIG. 2A, the trench openings 106 are horizontally extending (extending in Y direction) strip shaped trench openings arranged in parallel. In addition, as shown in FIG. 2B, each trench opening 106 vertically extends (in the Z direction) through the dielectric layers 104A and the sacrificial layers 104B of the multilayered structure 104 without exposing the underlying substrate layer 102. In one embodiment, the bottom surfaces 106BS of the trench openings 106 expose the bottommost dielectric layer 104A. In alternative embodiments, the trench openings 106 may extend through all the layers of the multilayered structure 104 and expose the underlying substrate layer 102. In some embodiments, the trench openings 106 are arranged in parallel and define region(s) where transistors (e.g., source electrodes and drain electrodes of the transistors) are to be formed. Further, the patterned dielectric layers 104A may function as insulating or isolation layers for isolating the subsequently formed transistors, and the patterned sacrificial layers 104B may be removed and replaced with gate layers for the transistors in subsequent processing.

In some embodiments, the patterning process for forming the trench openings 106 includes using acceptable photolithography and etching techniques. For example, an anisotropic etching process that is selective toward the multilayered structure 104 (e.g., etching the dielectric materials of the dielectric layers 104A and the sacrificial layers 104B at faster rates compared with the material(s) of the substrate layer 102). In some embodiments, the patterning process includes any acceptable etching process(es), such as a reactive ion etch (RIE), a neutral beam etch (NBE), the like, or a combination thereof. In some embodiments, once the trench openings 106 are formed, sidewalls 104SWA of the dielectric layers 104A and sidewalls 104SWB of the sacrificial layers 104B are exposed by the trench openings 106. As the dielectric layers 104A and the sacrificial layers 104B are patterned to form the trench openings 106, the sidewalls 104SWA of the dielectric layers 104A are substantially coplanar with the sidewalls 104SWB of the sacrificial layers 104B. Further, as shown in FIG. 2C, as the patterning process defines the region(s) where the transistors are subsequently formed (e.g., the trench openings 106), the multilayered structure 104 outside the region(s) is not etched during the patterning process.

Figures 3A, 3B, 3C:
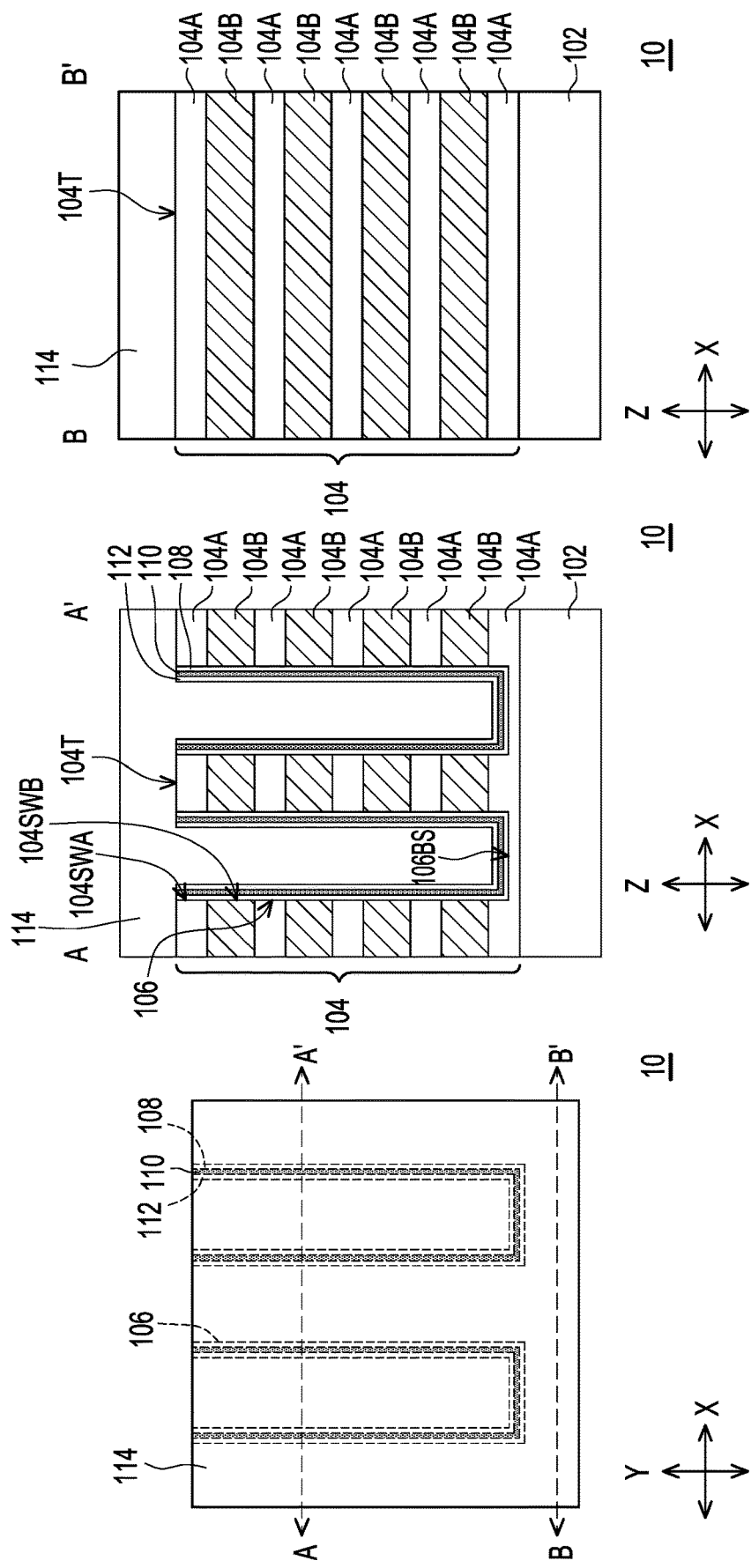

Referring to FIGS. 3A-3C, a memory layer 108, a semiconductor layer 110 and a capping layer 112 are sequentially deposited over the multilayered structure 104 and over the trench openings 106 in a conformal manner, in accordance with some embodiments. For example, the memory layer 108 is globally formed over the multilayered structure 104 to cover the multilayered structure 104, followed by forming (e.g. conformally deposited) the semiconductor layer 110 on the memory layer 108, and forming the capping layer 112 on the semiconductor layer 110. In some embodiments, the memory layer 108, the semiconductor layer 110 and the capping layer are sequentially formed and conformally cover the trench openings 106 (covering the bottom surfaces 106BS of the trench openings 106 as well as the sidewalls 104SWA, 104SWB and a top surface 104T of the multilayered structure 104). In some embodiments, the formation of the memory layer 108, the semiconductor layer 110 and the capping layer may involve performing one or more deposition processes such as CVD, ALD, physical vapor deposition (PVD), or a combination thereof.

In some embodiments, the memory layer 108 may function as a data storage layer for storing digital values. In some embodiments, the memory layer 108 is or includes a ferroelectric layer formed of a ferroelectric material, such as hafnium zirconium oxide (HZO), zirconium oxide (ZrO), undoped hafnium oxide (HfO), hafnium oxide doped with lanthanum (La), silicon, aluminum (Al), the like, or a combination thereof. In some other embodiments, the memory layer 108 may function as a charge trap layer, and the charge trap layer may include a composite of oxide-nitride-oxide (ONO) layers. In some embodiments, the semiconductor layer 110 may function as a channel layer or region of the transistor(s). In some embodiments, the semiconductor layer 110 is formed of a semiconductor material, and the acceptable semiconductor material includes an oxide semiconductor (OS) material, such as an indium-based oxide material (e.g., indium gallium zinc oxide (IGZO), indium tin oxide (ITO), indium gallium zinc tin oxide (IGZTO), zinc oxide (ZnO)), germanium, polysilicon, amorphous silicon, or the like. In some embodiments, the capping layer 112 is formed of a dielectric material similar to those of the dielectric layers 104A. In some embodiments, the capping layer 112 is formed of a high-k dielectric material. For example, the high-k material refers to a dielectric material having a dielectric constant greater than 7 and may include, but are not limited to, silicon nitride, hafnium oxide (e.g. $HfO_2$), titanium oxide, tantalum oxide (e.g. $Ta_2O_5$), aluminum oxide (e.g. $Al_2O_3$), zirconium oxide (e.g. ZrO 2). Other suitable dielectric materials are within the scope of the present disclosure.

Afterwards, as seen in FIG. 3B and FIG. 3C, a planarization process, such as a chemical mechanical polishing (CMP) process, may be performed to remove excess portions of the memory layer 108, the semiconductor layer 110 and the capping layer 112 from the top surface 104T of the multilayered structure 104. As a result, the remained memory layer 108, semiconductor layer 110 and capping layer 112 are located within the trench openings 106, and the top surfaces of the memory layer 108, the semiconductor layer 110 and the capping layer 112 are coplanar with and levelled with the top surface 104T of the structure 104. In some embodiments, as depicted in FIG. 3B, the memory layer 108, the semiconductor layer 110 and the capping layer 112 located within one trench opening 106 are physically separate from the memory layer 108, the semiconductor layer 110 and the capping layer 112 located within another trench opening 106.

Still referring to FIGS. 3A-3C, subsequent to the planarization process, a dielectric material 114 is formed over the multilayered structure 104, filling into the trench openings 106 and covering the multilayered structure 104 and the capping layer(s) 112. For example, as seen in FIG. 3B, the dielectric material 114 is formed over the multilayered structure 104 to fill up the trench openings 106 and cover the capping layer(s) 112 inside the trench openings 106. As seen in FIG. 3C, in some embodiments, the dielectric material 114 may be deposited directly on the top surface 104T of the multilayered structure 104 outside the region(s) where the trench openings 106 are formed. In some embodiments, a material of the dielectric material 114 may be the same as the material(s) of the dielectric layers 104A. In alternative embodiments, the material of the dielectric material 114 may be different from the material(s) of the dielectric layers 104A. Further, in some embodiments, the dielectric material 114 is formed using a deposition process such as CVD, ALD, or the like. It is noted that the outlines of the memory layer 108, the semiconductor layer 110 and the capping layer 112 and the trench openings 106 are schematically shown in dotted lines in FIG. 3A as they are covered by the dielectric material 114.

Referring to FIGS. 4A-4C, in some embodiments, vertical trench openings 116 are formed in the multilayered structure 104 neighboring each trench opening 106 along Y direction. For example, in a plan view of FIG. 4A, the vertical trench openings 116 are formed at ends of the strip shaped trench openings, but the locations of the trench openings 116 are not limited by the embodiments herein. As shown in FIG. 4C, each trench opening 116 penetrates through the multilayered structure 104 and extends vertically (along the Z direction) through most of the multilayered structure 104 without exposing the underlying substrate layer 102. In one embodiment, the bottom surfaces 116BS of the trench openings 116 expose the bottommost dielectric layer 104A. In one embodiment, the vertical trench openings 116 are formed with a depth substantially the same as the depth of the trench openings 106. That is, the bottom surfaces 106BS of the trench openings 106 and the bottom surfaces 116BS of the trench openings 116 are at the same level. Similarly, in alternative embodiments, the trench openings 116 may extend through all layers of the multilayered structure 104 but stops at the substrate layer 102. In addition, as seen from FIG. 4B, the memory layer 108, the semiconductor layer 110 and the capping layer in the trench openings 106 remain intact during the formation of the trench openings 116.

In some embodiments, the formation of the trench openings 116 involves using acceptable photolithography and etching techniques. For example, the formation of the trench openings 116 involves performing one or more anisotropic etching processes, such as RIE, NBE, the like, or a combination thereof. Referring to FIG. 2B and FIG. 4C together, in some embodiments, the trench openings 106 and the trench openings 116 are depicted to have vertical straight sidewalls, but it is understood that the profiles of the sidewalls may be slant or slight curved depending on the conditions of the etching processes.

Referring to FIGS. 5A-5C, in some embodiments, the sacrificial layers 104B are selectively removed from the multilayered structure 104. In some embodiments, a selective etching process is performed so that the dielectric layers 104A remain substantially intact during removal of the sacrificial layers 104B. For example, the dielectric material of the sacrificial layers 104B is chosen to have a much higher etching rate than that of the dielectric material of the dielectric layers 104A. In some embodiments, the selective etching process includes a dry etching process (e.g., RIE, NBE). In some embodiments, the selective etching process includes an isotropic etching process or a wet etching process.

Following the removal of the sacrificial layers 104B, sidewall recesses 118 are formed between the dielectric layers 104A and the memory layer 108. As seen in FIG. 5B and FIG. 5C, the opposing (upper and lower) surfaces of the dielectric layers 104A and the memory layer 108 formed on the sidewalls of the trench openings 106 that are previously in contact with the sacrificial layers 104B are exposed, for example. As shown in FIG. 5C, in some embodiments, through the trench openings 116, the horizontally extending sidewall recesses 118 are spatially communicated with one another. As the dielectric layers 104A remain substantially intact after the removal of the sacrificial layers 104B, the respective heights of the sidewall recesses 118 are substantially equal to the thickness of the sacrificial layers 104B.

Referring to FIGS. 6A-6C, in some embodiments, conductive layers 120 are formed in the sidewall recesses 118 respectively. In other words, the previously-formed sacrificial layers 104B in the multilayered structure 104 are replaced by the conductive layers 120, and such process may be regarded as the replacement process of the gate electrode (i.e., gate replacement process). In the disclosure, the conductive layers 120 function as the gate electrodes of the transistors and are further referred to as gate layers. In some embodiments, the conductive material of the conductive layers 120 includes one or more metal or metallic materials selected from tungsten, ruthenium, molybdenum, cobalt, aluminum, nickel, copper, silver, gold, alloys thereof, nitride thereof or a combination thereof. In some embodiments, the conductive layers 120 are formed by a deposition process such as CVD (e.g. PECVD or metal organic CVD), ALD, or the like. In some embodiments, extra conductive material not covered by the dielectric layers 104A may be removed by an etching process (e.g., an "etch-back" process), and the dielectric layers 104A may function as shadow masks during such etching process, and such patterning of the conductive material can be considered as a self-aligning process. The etching process performed to remove the excess conductive material may be anisotropic or isotropic. Each of the conductive layers 120 has a thickness similar with that of the sacrificial layers 104B.

In FIGS. 6A-6C, the dielectric layers 104A and the conductive layers 120 are stacked in alternation on the bottommost dielectric layer 104A, and the stacked layers together form stacks 1041 over the substrate layer 102. As seen in FIG. 6B, along the cross-sectional line A-A', the conductive layers 120 fill up the sidewall recesses 118, and the stacks 1041 are respectively separated and laterally spaced apart from one another by the memory layer 108, the semiconductor layer 110, the capping layer 112 and the dielectric material 114 filled within the trench openings 106. As seen in FIG. 6C, along the cross-sectional line B-B', the conductive layers 120 that fill up the sidewall recesses 118 are separated and spaced apart from one another by trench openings 116. As show in FIG. 6B, in some embodiments, the sidewalls 120SW of the conductive layers 120 are substantially coplanar with the sidewalls 104SWA of the dielectric layers 104A, as the conductive layers 120 are confined by the memory layer 108, the semiconductor layer 110, the capping layer 112 and the dielectric material 114 filled within the trench openings 106. In some embodiments, in FIG. 6C, the sidewalls 120SW of the conductive layers 120 are substantially coplanar with the sidewalls 104SWA of the dielectric layers 104A. The sidewalls 120SW of the conductive layers 120 and the sidewalls 104SWA of the dielectric layers 104A may together referred to as sidewalls 1041SW of the stacks 1041. In some embodiments, the sidewalls 1041SW of the stacks 1041 include substantially vertical sidewalls. In some embodiments, the sidewalls 1041SW of the stacks 1041 include sloped or slant sidewalls depending on the sidewall profiles of the trench openings 106 and/or the trench openings 116. Further, as illustrated in FIG. 6B, the sidewalls 1041SW of the stacks 1041 are in contact with and directly covered by the memory layer 108.

Figures 7A, 7B, 7C:
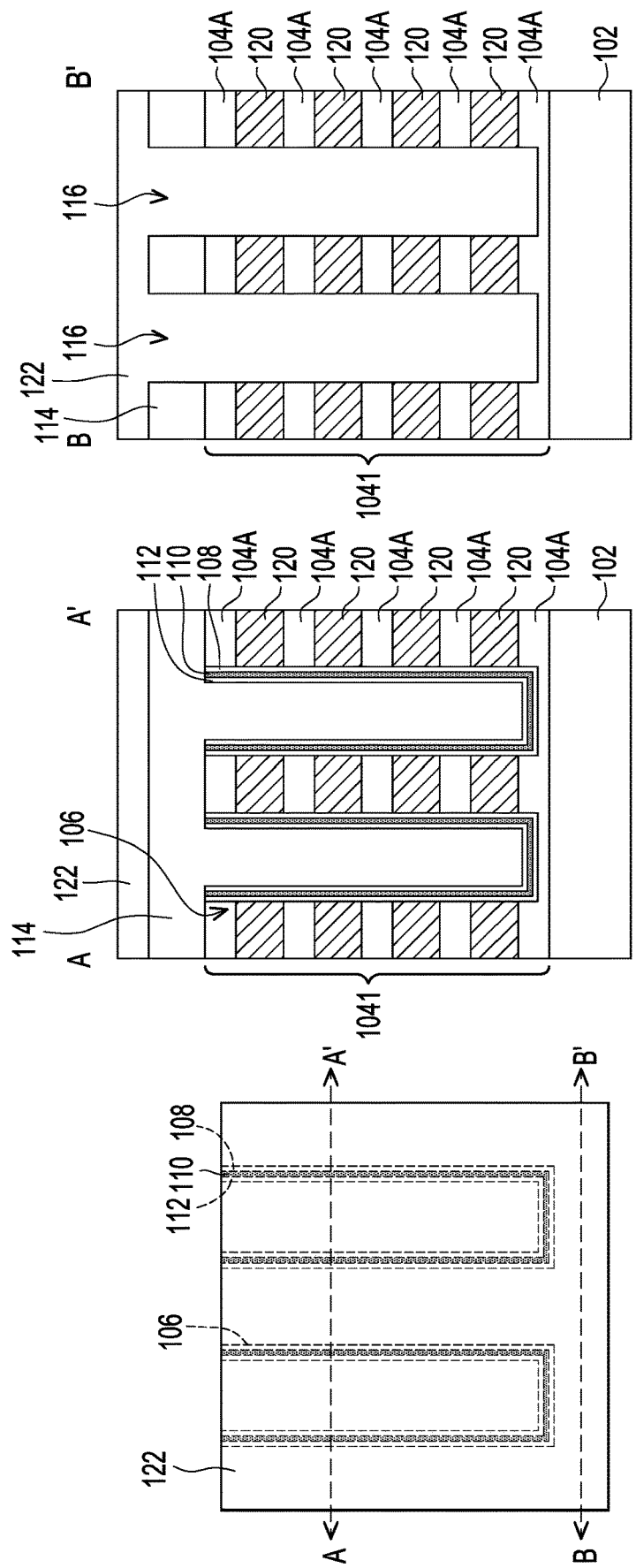

Referring to FIGS. 7A-7C, in some embodiments, a dielectric material 122 is globally formed over the structure as shown in FIG. 6A. As shown in FIGS. 7A-7C, the dielectric material 122 is deposited over the stacks 1041 and fills the trench openings 116. A material of the dielectric material 122 may be the same as the material of the dielectric layers 104A or the material of the dielectric material 114. Alternatively, the material of the dielectric material 122 may be different from the material of the dielectric layers 104A and/or the material of the dielectric material 114. In some embodiments, a method of forming the dielectric material 122 includes a deposition process such as CVD, ALD, or the like.

Figure 8B:
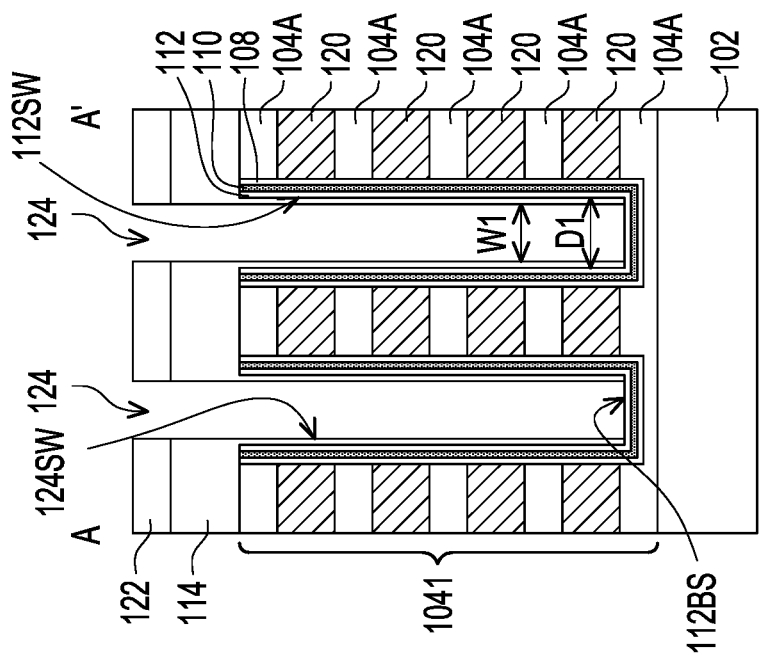
Figure 8A:
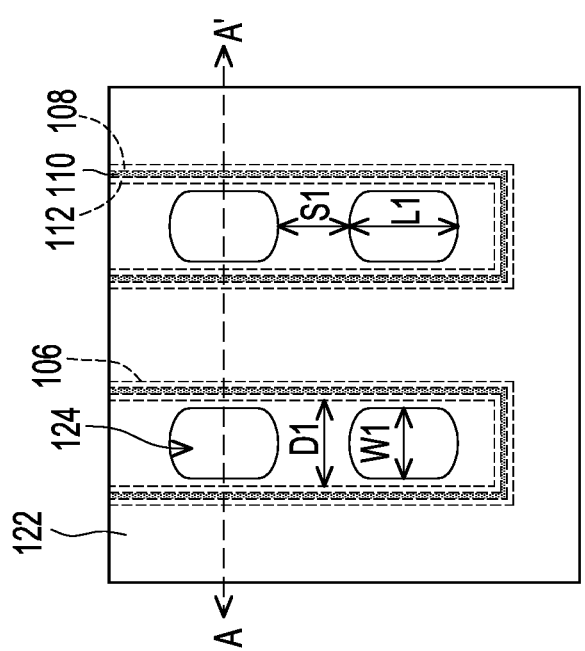

Turing to FIG. 8A and FIG. 8B, in some embodiments, a plurality of trench openings 124 are formed within each trench openings 106 that are formerly formed. For example, the trench openings 124 are formed by partially removing the dielectric material 114 and the dielectric material 122 within the previously-formed trench openings 106 to expose bottom surfaces 112BS of the capping layers 112 in the trench openings 106 without exposing the capping layers located on the sidewalls of the trench openings 106. For illustrative purposes only, each trench opening 106 is shown with two trench openings 124 in FIG. 8A. However, more trench openings may be adopted, depending on design requirements.

Referring to FIG. 8A and FIG. 8B, portions of the dielectric material 114 that are remained on the capping layers 112 located on the sidewalls of the trench openings 106 define sidewalls 124SW of the trench openings 124. In FIG. 8A and FIG. 8B, the trench opening 124 has a width W1 (in the X direction) less than a distance D1 between capping layers 112 on the sidewalls of two adjacent stacks 1041. That is, the trench openings 124 are formed to be narrower (in the X direction) than the dielectric material filled in the trench openings 106 and the trench openings 106 are formed without laterally etching through the dielectric material 114 such that sidewalls 112SW of the capping layer 112 remain covered by the dielectric material 114. In some embodiments, the trench openings 124 are formed with a length L1 in the Y direction, and the adjacent two trench openings 124 are spaced apart in the Y direction by a spacing S1.

A method for forming the trench openings 124 may include, but is not limited to, using a photolithography process and an anisotropic etching process to partially remove the dielectric material 114 and the overlying dielectric material 122. For example, a photoresist (not shown) may be formed on the dielectric material 122 using a suitable deposition process such as spin-on technique, followed by patterning the photoresist to expose portions of the dielectric material 122 at desirable locations using acceptable photolithography techniques. The exposed portions of the dielectric material 122 are then etched using the patterned photoresist as a mask. In some embodiments, the anisotropic etching process includes wet etching, dry etching, RIE, NBE, the like, or a combination thereof. The photoresist is then removed, such as by an acceptable ashing or wet strip process. In some embodiments, the sidewalls 124SW of the trench opening 124 are substantially vertical and plan after the etching process.

Figures 9A, 9B:
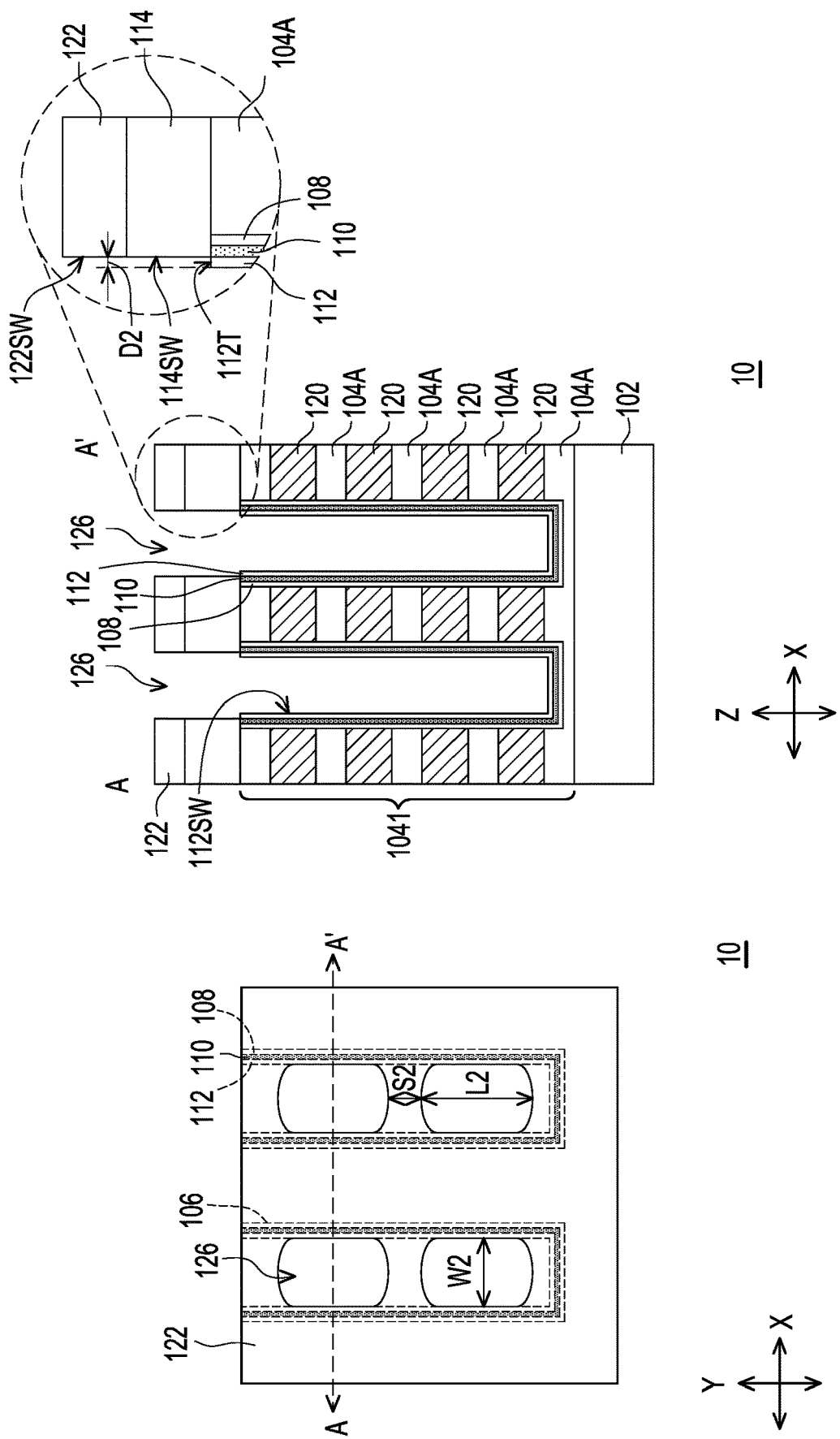

Referring to FIG. 9A and FIG. 9B, in some embodiments, an opening-expanding process is performed so that each trench opening 124 is further enlarged to become an expanded trench openings 126. In some embodiments, the expanded trench openings 126 are formed at locations corresponding to the locations of later-to-be-formed source electrodes and drain electrodes of the transistors. Referring to FIG. 8A and FIG. 9A together, in some embodiments, the trench openings 124 are expanded or enlarged in both X direction and Y direction without increasing the depth of the trench openings 124 to form the trench openings 126. That is, the expanded trench openings 126 are formed with a width W2 and a length L2 (of each trench opening 126), and the width W2 and the length L2 are respectively larger than the width W1 and the length L1 of the trench openings 124. In some embodiments, the width W2 is substantially the equivalent to the distance D1 described above, and a spacing S2 between two adjacent trench openings 126 is smaller than the spacing S1 between two adjacent trench openings 124. In some embodiments, the trench openings 126 are formed to expose surfaces of the sidewalls 112SW of the capping layer 112.

In some embodiments, the opening-expanding process for forming the trench openings 126 includes performing a laterally etching process to widen the previously-formed trench openings 124. For example, the opening-expanding process includes performing a pulling back etching process to remove portions of the dielectric material 114 and the dielectric material 122. In some embodiments, the formation of the trench openings 126 inside the trench openings 106 is self-limited by the capping layers 112, and the capping layers 112 within the trench openings 106 are exposed by removing the dielectric material 114 on the sidewalls 112SW of the capping layers 112 within the trench openings 106. During the opening-expanding process, the dielectric material 114 and the dielectric material 122 above the multilayered structure 104 are laterally etched and retreated so that there is a distance D2 between the trimmed sidewalls 122SW/114SW of the dielectric materials 122/114 and the exposed sidewalls 112SW of the capping layer 112.

In some further embodiments, as the dielectric materials 122/114 above the multilayered structure 104 are laterally etched, portions of top surface 112T of the capping layer 112 are exposed. Depending on the size of the distance D2 and the thickness of the respective layers within the trench openings 106, portions of top surfaces of the memory layer 108, the semiconductor layer 110, the capping layer 112 may be exposed. The remaining portions of the dielectric material 114 and the remaining portions of the dielectric material 122 may collectively serve as hard masks for subsequent etching processes (e.g., the process step shown in FIG. 12B). In some embodiments, the opening-expanding process includes, but are not limited to, dry etching, wet etching, atomic layer etching (ALE), the like, or a combination thereof.

Referring to FIG. 10A and FIG. 10B, in some embodiments, a sacrificial material 128 is globally formed over the structure as shown in FIG. 9A. For example, the sacrificial material 128 is deposited to fill up the trench openings 126 and further cover the dielectric materials 114, 122. In some embodiments, the sacrificial material 128 includes a material that is the same as the material of the sacrificial layers 104B. Alternatively, the material of the sacrificial material 128 may be different from the material of the sacrificial layers 104B. Further, in some embodiments, the sacrificial material 128 is formed using a deposition process such as CVD, ALD, or the like.

Figure 11B:
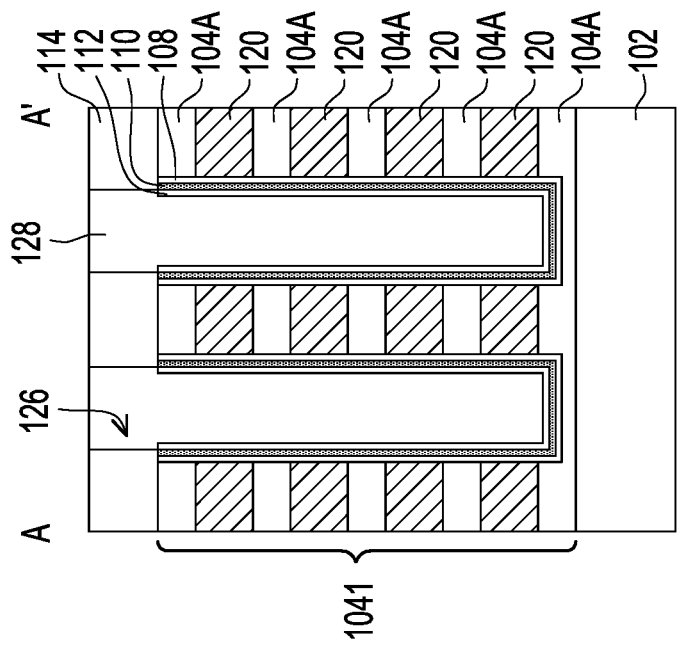
Figure 11A:
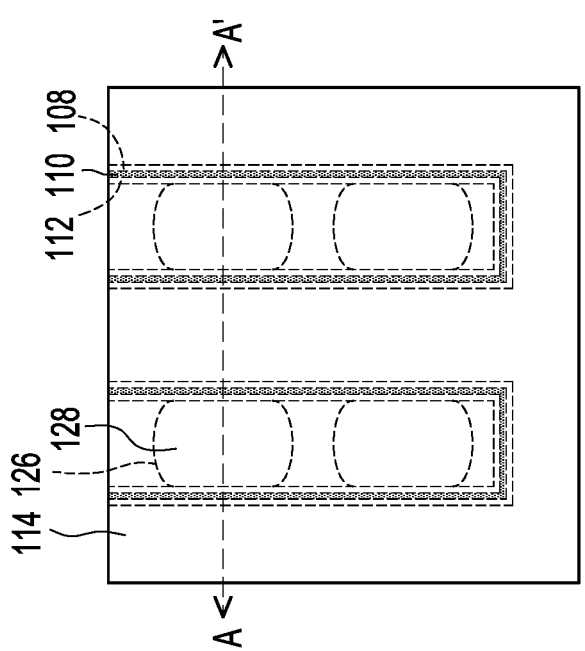

Referring to FIG. 11A and FIG. 11B, a planarization process is performed to remove the extra sacrificial material 128. The planarization process is carried out to remove the dielectric material 122 and portions of the sacrificial material 128. The planarization process may include, for example, a CMP process, an etching process (e.g., etch-back) or a combination thereof. As shown in FIG. 11B, illustrated top surfaces of the sacrificial material 128 may be substantially coplanar to and levelled with the illustrated top surfaces of the dielectric material 114. As seen in FIG. 11B, the remained sacrificial material 128 is mainly located within the trench openings 126 or located within the spans of the trench openings 126.

Figures 12A, 12B, 12C:
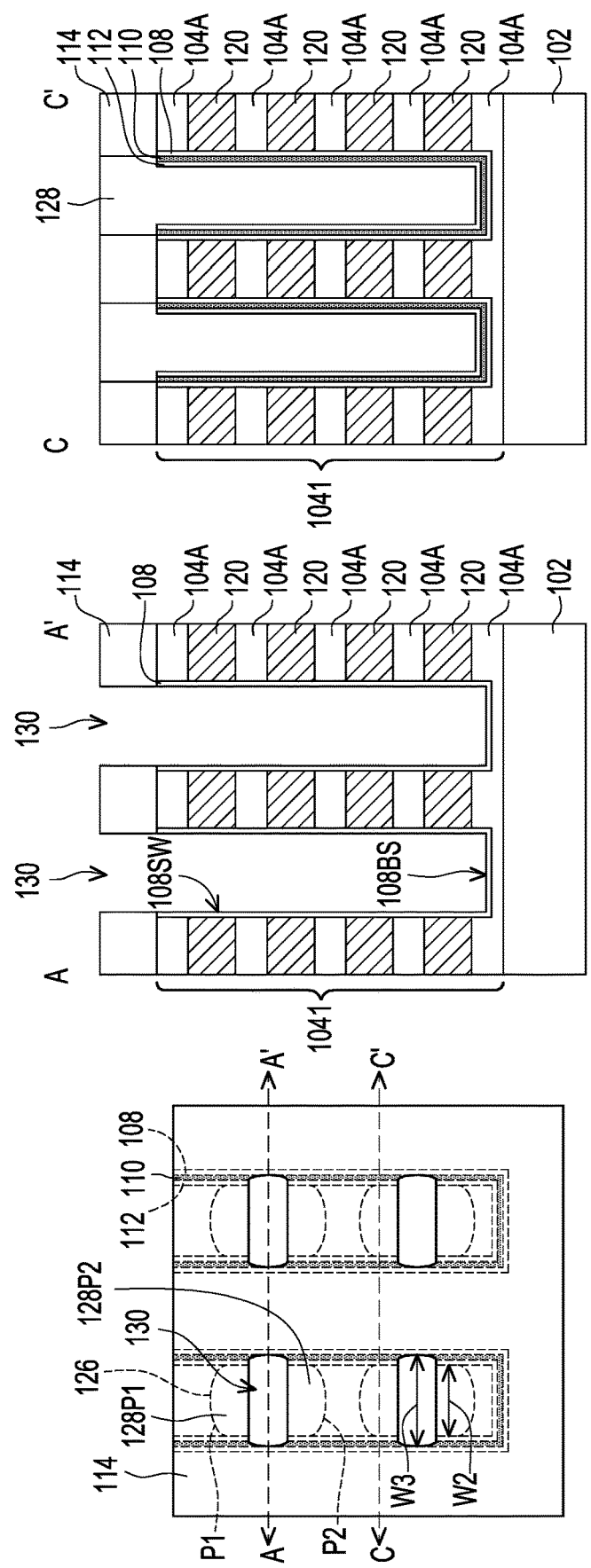

Referring to FIGS. 12A-12C, in some embodiments, trench openings 130 are formed in the sacrificial material 128, and each trench opening 130 divides the sacrificial material 128 located inside each trench opening 126 into two portions 128P1 and 128P2. In some embodiments, the trench openings 130 are formed by partially removing the sacrificial material 128, the capping layer 112 and the semiconductor layer 110 that are located in the trench openings 126 until the memory layer 108 is exposed. Each trench opening 130 may be formed to, for example, expose a bottom surface 108BS and opposing sidewalls 108SW of the memory layer 108, as shown in FIG. 12B.

As seen in FIG. 12C, at locations without forming the trench openings 130 or locations outside the trench openings 130, the sacrificial material 128, the capping layer 112, the semiconductor layer 110 and the memory layer 108 located within the trench openings 126 remain intact. By forming the trench opening 130, the trench opening 126 (currently filled with the sacrificial material 128) is also defined with two semi-trench portions P1 and P2 for accommodating the two portions 128P1 and 128P2 respectively. In one embodiment, as the trench opening 130 is located in the middle of the trench opening 126, the divided portions 128P1 and 128P2 are symmetrical with each other. In some embodiments, each trench opening 130 separates the two portions 128P1 and 128P2 (as well as the portions P1 and P2). In some embodiments, as illustrated in FIG. 12A, after the trench openings 130 are formed, the divided portions 128P1 and 128P2 (as well as the portions P1 and P2) have D-shaped top views, and the straight sidewalls of the portions 128P1 and 128P2 face each other and the curve sidewalls of the portions 128P1 and 128P2 are not in contact with and away from the respective trench opening 130. As seen in the plan view of FIG. 12A, owing to the removal of the capping layer 112 and the semiconductor layer 110 during the formation of the trench openings 130, the trench opening 130 has a width W3 larger than the width W2 of the previously-formed trench opening 126 (the same width W2 of the portions P1 and P2).

A method for forming the trench openings 130 may include performing one or more etching processes to remove portions of the semiconductor layer 110, the capping layer 112 and the sacrificial material 128. For example, the formation of the trench openings 130 involves performing one or more anisotropic etching processes, such as RIE, NBE, the like, or a combination thereof.

Figures 13A, 13B, 13C:
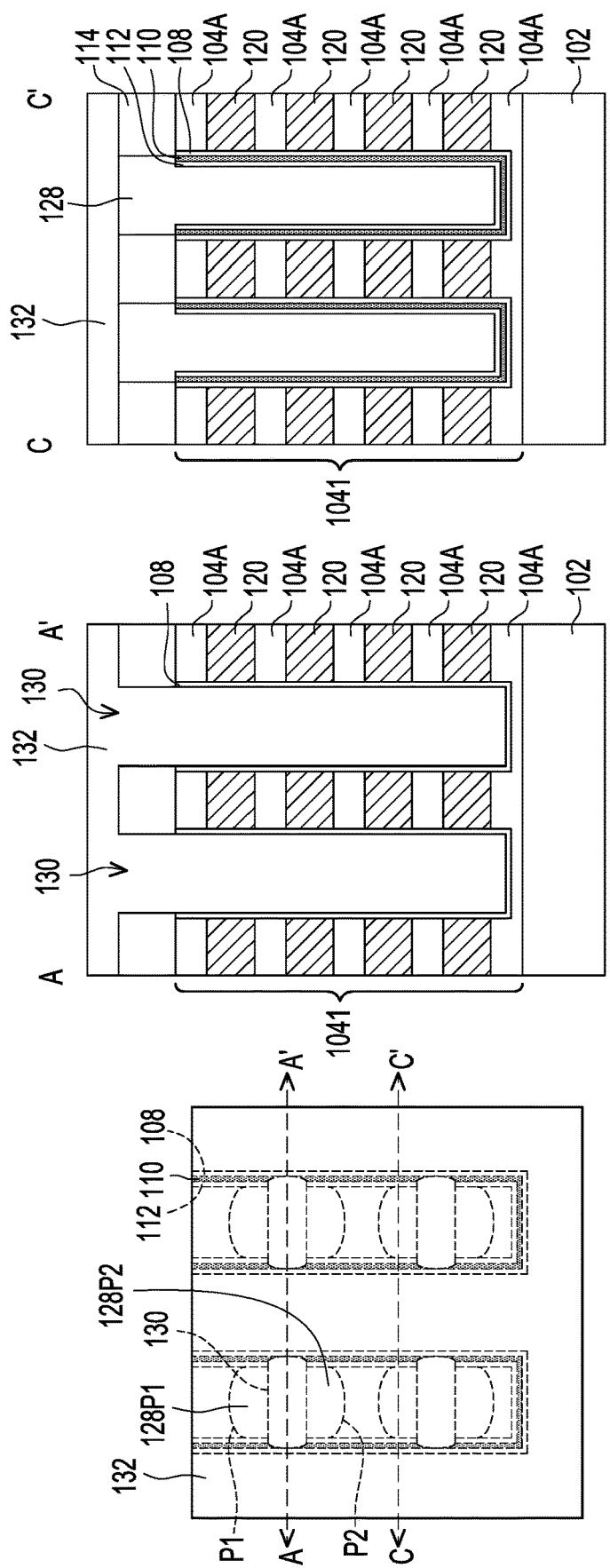

Referring to FIGS. 13A-13C, in some embodiments, a dielectric material 132 is globally formed over the structure as shown in FIG. 12A. For example, the dielectric material 132 is deposited to fill up the trench openings 130 and further cover the remaining portions of the dielectric material 114 (see FIG. 13B). Further, as illustrated in FIG. 13C, the dielectric material 132 is deposited on the sacrificial material 128 remaining in the portions P1 and P2 as well as on the remaining portions of dielectric material 114. In some embodiments, a material of the dielectric material 132 may be the same as the material of the dielectric material 114. Alternatively, the material of the dielectric material 132 may be different from the material of the dielectric material 114. Further, in some embodiments, the dielectric material 132 is formed using a deposition process such as CVD, ALD, or the like.

Figures 14A, 14B, 14C:
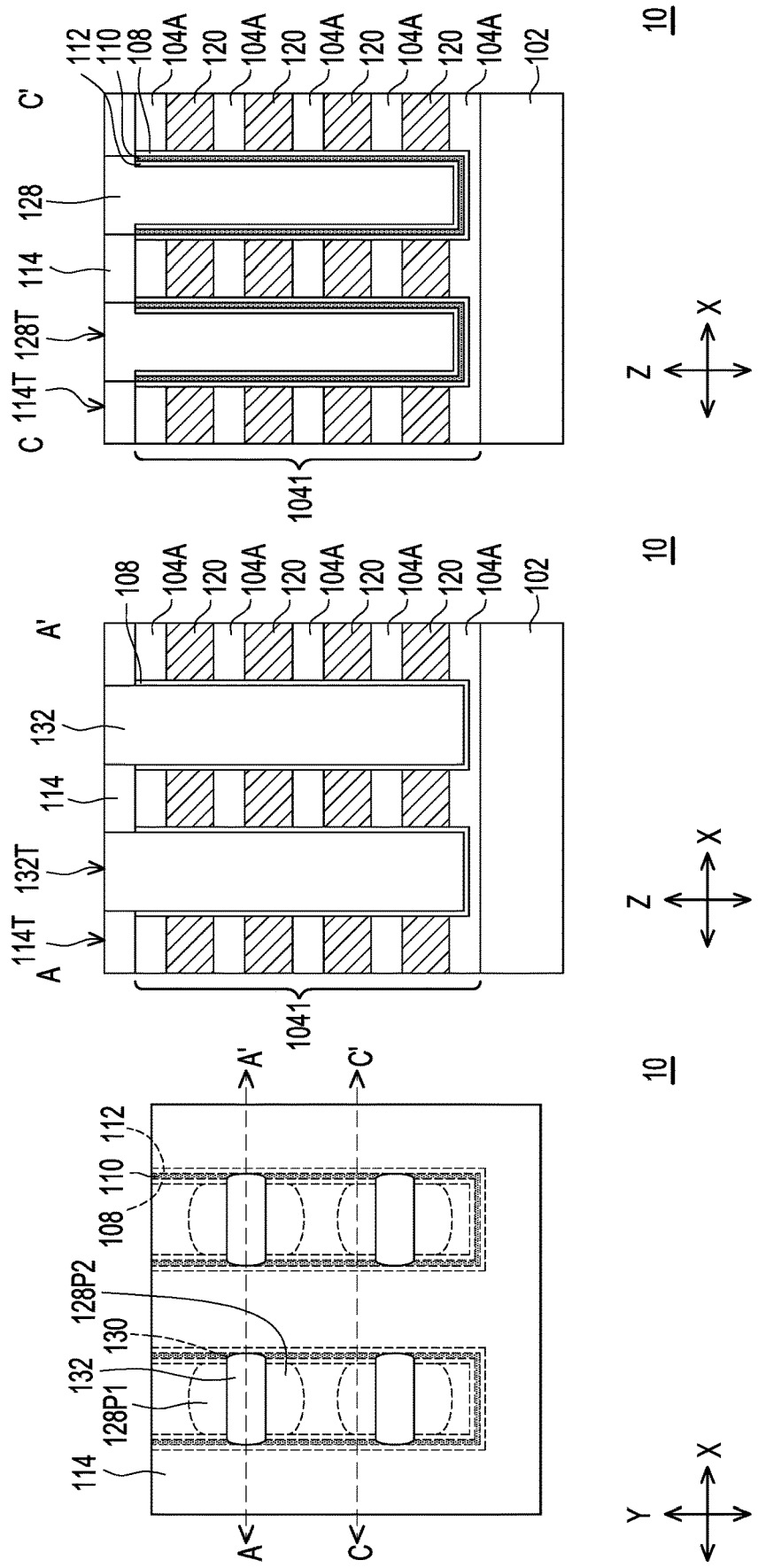

Referring to FIGS. 14A-14C, a structure as shown in FIG. 13A is then planarized with a planarization process. In some embodiments, the planarization process is carried out to remove portions of the dielectric material 132 until the underlying dielectric material 114 is exposed. In some embodiments, the planarization process removes portions of the dielectric material 132 as well as portions of the underlying dielectric material 114 and portions of the underlying sacrificial material 128. After the planarization, as illustrated in FIG. 14B, the top surfaces 114T of the dielectric material 114 are substantially coplanar to and levelled with the top surfaces 132T of the dielectric material 132 (see FIG. 14B) and the top surfaces 128T of the sacrificial material 128 (see FIG. 14C), respectively. The planarization process may include, for example, a CMP process, an etching process (e.g., etch-back) or a combination thereof. Herein, the filled trench openings 130 (filled with the planarized dielectric material 132) may serve as isolation structures between later-formed adjacent memory cells.

Figure 15B:
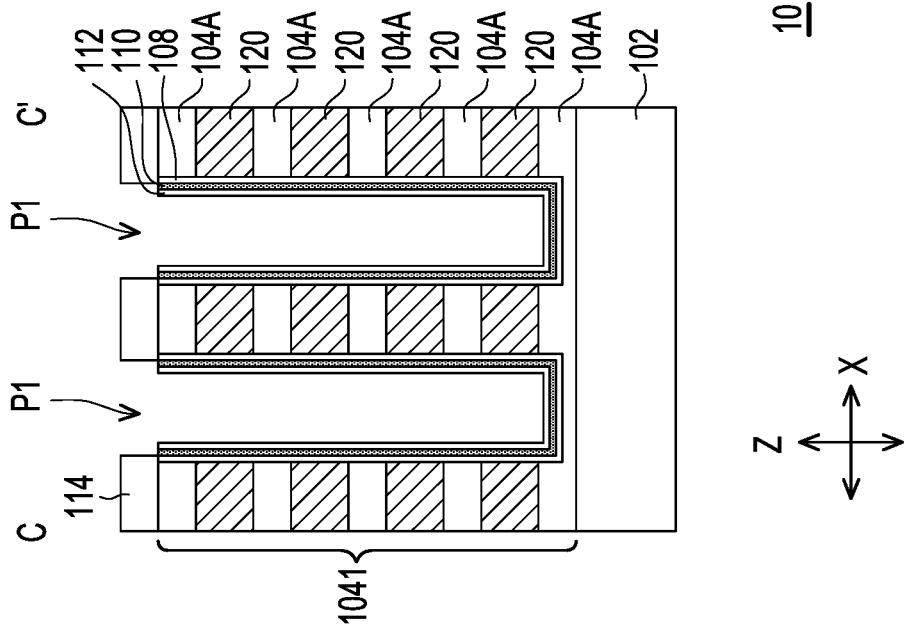
Figure 15A:
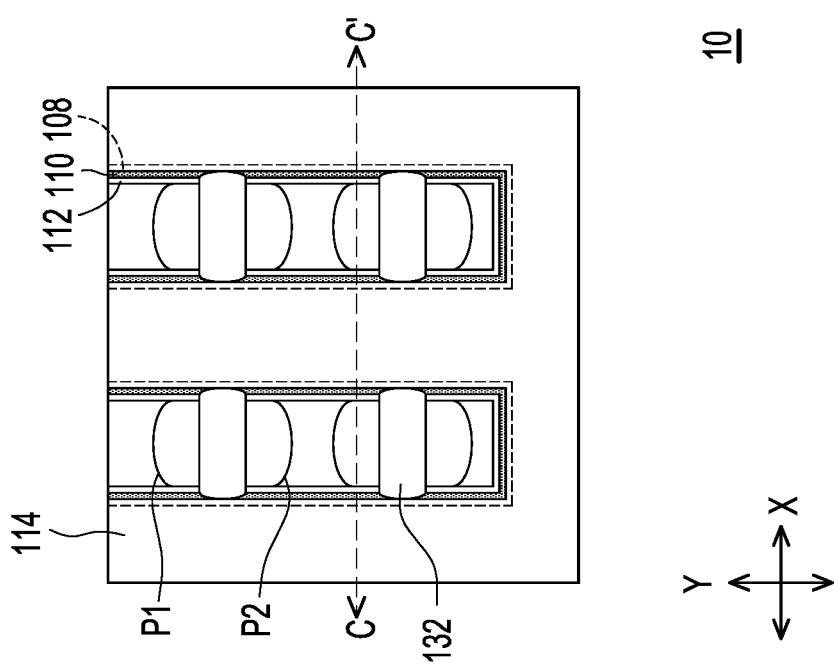

Referring to FIG. 15A and FIG. 15B, in some embodiments, the remaining portions 128P1 ad 128P2 of the sacrificial material 128 within the semi-trench portions P1 and P2 are fully removed, so that the cap layers 112 located within the semi-trench portions P1 and P2 are exposed. The removals of the sacrificial material 128 from the portions P1 and P2 may be achieved by performing an acceptable etch process, such as a dry etch (e.g., RIE, NBE, the like), a wet etch, the like, or a combination thereof. The etching process may be anisotropic or isotropic.

Figures 16A, 16B:
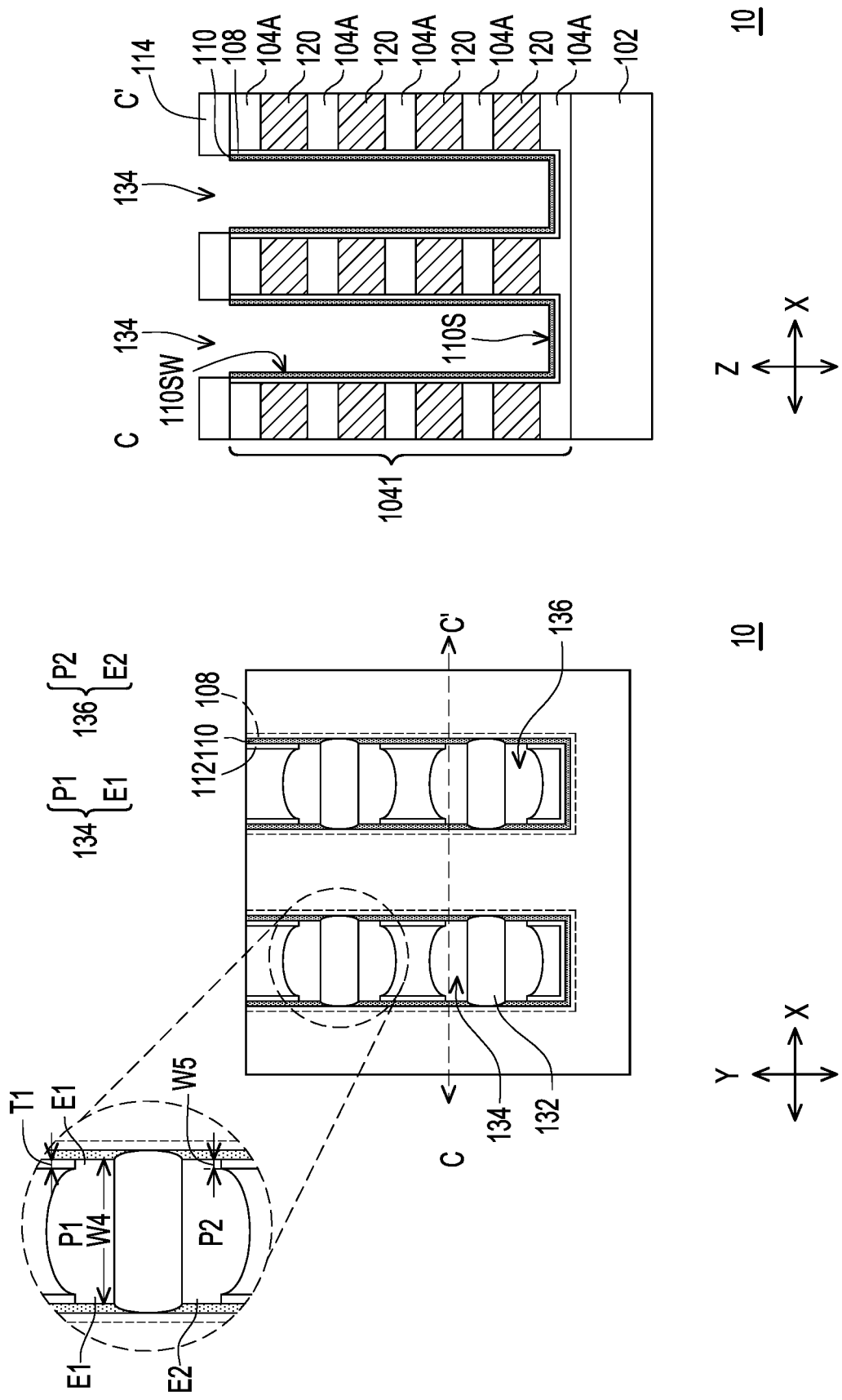

Referring to FIG. 16A and FIG. 16B, in some embodiments, a selective etching process is performed to remove the exposed capping layers 112 located alongside the semi-trench portions P1 and P2 (e.g., located at opposing sides of the portions P1 and P2). The selective etching process may laterally expand the widths of the semi-trench portions P1 and the portions P2 (expanding from the widths W2 widths W4). Through the selectively etching off the capping layer 112 alongside the portions P1 and P2, a pair of extended trench portions E1 (i.e., lateral portions) is formed at the opposing sides of each portion P1 and a pair of extended portions E2 (i.e., lateral portions) is formed at the opposing sides of each portion P2. As illustrated in FIG. 16A, from the schematic plan view, each portion P1 or P2 joining with the corresponding pair of expended portions E1 or E2 may be collectively referred to as an electrode through-hole 134 or 136, and the electrode through-holes 134 and 136 further define regions for accommodating source electrode and drain electrode formed therein. In some embodiments, the electrode through-hole 134 or 136 has the width W4, and the difference between the width W4 and the width W2 (W4-W2) is about the sum of the thickness of the removed capping layers 112 at opposite sides. In other words, a width W5 of each extended portion E1 and E2 is substantially the same as a thickness T1 of the capping layer 112. In one embodiment, each extended portion E1 and E2 is in a rectangular top-view shape; however, the disclosure is not limited thereto.

A method for forming electrode through-holes 134 and 136 may include performing an anisotropic etching process such as by wet or dry etching, RIE, NBE, the like, or a combination thereof to remove portions of the capping layer 112. Subsequent to the removal of the portions of the capping layer 112, each of the electrode through-holes 134 and 136 exposes sidewalls 110SW of the semiconductor layer 110 on opposing sides thereof. As illustrated in FIG. 16B, from a cross-sectional view, a surface 110S and sidewalls 110SW of the semiconductor layer 110 are respectively exposed by the electrode through-holes 134 and 136.

Figure 17A:
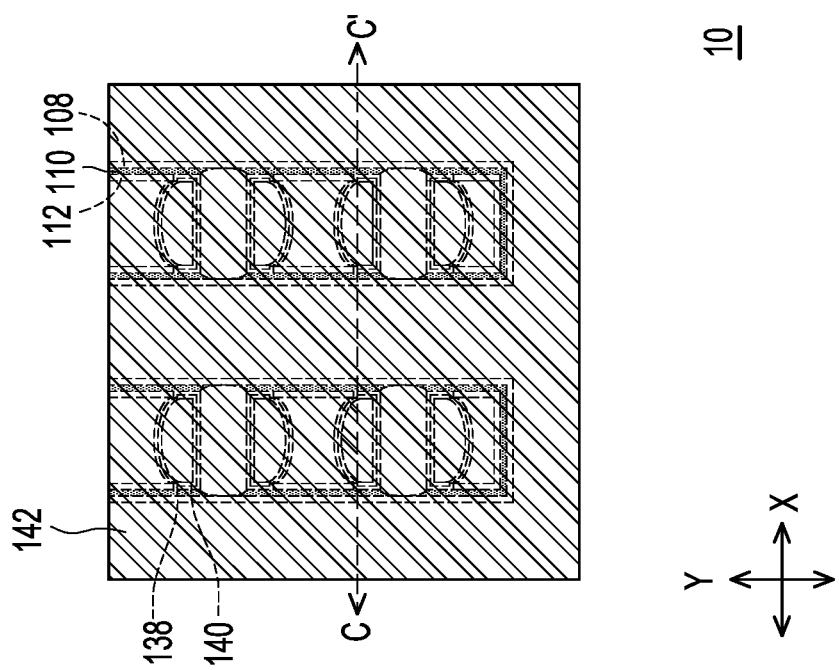
Figure 17B:
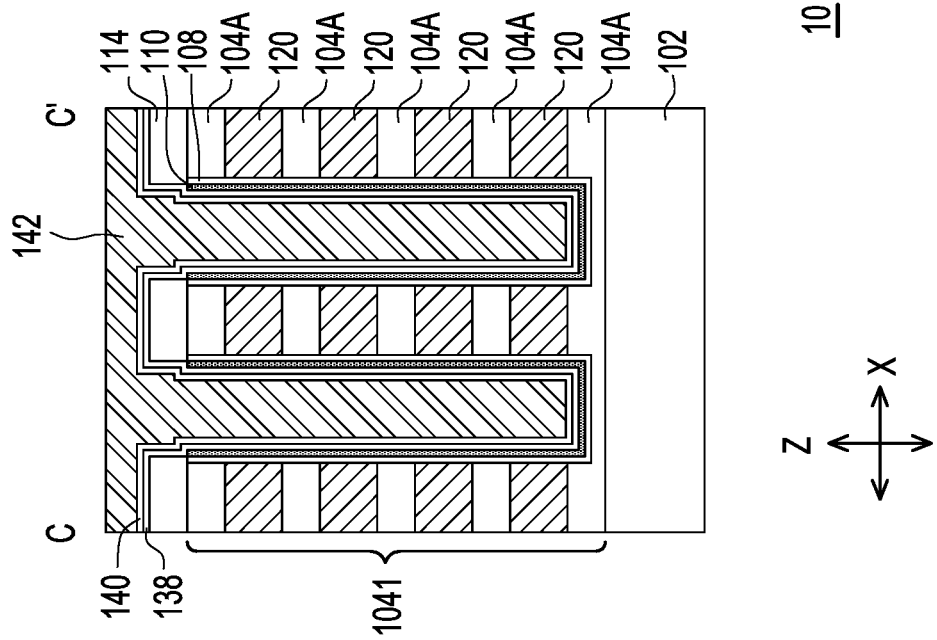

Referring to FIG. 17A and FIG. 17B, in some embodiments, a stack of a barrier layer (e.g., protective layer) 138 and a glue layer (e.g., adhesion layer) 140 is globally formed over the structure as shown in FIG. 16A. For example, the barrier layer 138 and the glue layer 140 are sequentially and conformally formed on the exposed surfaces of the electrode through-holes 134 and 136 and on the top surfaces of the remaining portions of the dielectric material 114. In some embodiments, the barrier layer 138 is formed of an acceptable dielectric material with its conductivity about between semiconductor and metal, such as indium tin oxide (ITO), indium oxide (InO), or the like. In other embodiments, the glue layer 140 is formed of a conductive material such as a metal nitride. For example, the material of the glue layer 140 includes titanium nitride, tantalum nitride, molybdenum nitride, zirconium nitride, hafnium nitride, or the like. In addition, the barrier layer 138 and the glue layer 140 may be deposited using suitable deposition process such as CVD, ALD, PVD, or the like.

A conductive material 142 is then formed over the lining stack of the barrier layer 138 and the glue layer 140. For example, the conductive material 142 may be deposited to fill up the electrode through-holes 134 and 136. In some embodiments, the conductive material 142 is formed of an acceptable conductive material such as metal materials. For example, the acceptable conductive material includes tungsten, copper, ruthenium, the like, or a combination thereof. The conductive material 142 may be deposited using suitable deposition process such as CVD, ALD, PVD, or the like.

Referring to FIG. 18A and FIG. 18B, a structure as shown in FIG. 17A is then planarized with a planarization process, and a 3D memory array 10 is manufactured. For example, the planarization process removes portions of the conductive material 142, portions of the glue layer 140, portions of the barrier layer 138 and the dielectric material 114 until the top surface of the topmost dielectric layer 104A is exposed (i.e. the top surfaces 104IT of the stacks 104I are exposed), and the remined portions of the conductive material 142 become pillar-shaped conductive structures 160 (i.e. conductive pillars) and the remained barrier layer 138 and glue layer 140 become a liner layer wrapping around the conductive pillars 160. The planarization process may include, for example, a CMP process, an etching process (e.g., etch-back) or a combination thereof. As shown in FIG. 18B, after the planarization, the top surfaces 104IT of the stacks 104I may be substantially coplanar to and levelled with the top surfaces 142T of the remained conductive material 142. Further, the top surfaces of the remained memory layer 108 and semiconductor layer 110, and the remained barrier layer 138 and glue layer 140 may also be substantially coplanar to and levelled with the top surfaces 104IT and 142T. The conductive structures 160 together with the surrounding liner layer function as source and drain electrodes.

In some embodiments, the 3D memory array 10 is a non-volatile memory array, such as a NOR memory array. For example, the 3D memory array 10 includes multiple memory cells MC1 arranged in a form of array and stacked along a vertical direction (e.g., the Z direction). In some embodiments, each memory cell MC1 at least includes the source electrode S1, the drain electrode D1 and the gate electrode 120. The source electrode S1 and the drain electrode D1 each include the conductive structure 160 and the liner layer (including the barrier layer 138 and the glue layer 140) conformally wrapping around the conductive structure 160. The conductive layer 120 within the stack 1041 beside the source electrode S1 and drain electrode D1 functions as the gate electrode. In addition, each memory cell MC1 further includes a channel region (the semiconductor layer 110 beside the pair of conductive structures 160) and the gate dielectrics (the memory layer 108 intersecting the conductive layer 120 of the stack 1041 and between the pair of conductive structures 160).

Referring to FIG. 18A, FIG. 17A and FIG. 16A, as the conductive material 142 filling up the semi-trench portions P1 and P2 and the extended trench portions E1 and E2, the later formed conductive pillars 160 have kink portions 165 (i.e. lateral angled portions). In some embodiments, as each electrode through-hole includes the semi-trench portion P1/P2 and a pair of extended trench portions E1/E2 at the opposing sides of each semi-trench portion P1/P2, each conductive structure 160 includes a pair of kink portions 165 filled inside the extended trench portions E1/E2 at the opposing sides of the conductive structure 160.

In some embodiments, referring to FIG. 18A and FIG. 18B, the memory cells MC1 may be arranged along an extending direction (e.g., the Y direction which may be referred to as a trench direction) of the previously-described trench openings 106, where the trench openings 106 are arranged side-by-side (e.g., in parallel) along a lateral direction (e.g., the X direction). From a top view, the memory layer 108 may include a ring-shaped wall structure extending along the trench direction (e.g., the Y direction) that corresponds to a shape of the previously-formed trench openings 106, as seen in FIG. 18A. The lateral direction (e.g., the X direction), the trench direction (e.g., the Y direction) and the vertical direction (e.g., the Z direction) may be different from one another. For example, the X direction and the Y direction are substantially perpendicular to the Z direction, and the X direction is substantially perpendicular to the Y direction.

Further, as shown in FIG. 18A, a first isolation structure 150 (region where the dielectric material 114 filled in the previously-described trench openings 106) is located between the pair of conductive structures 160, and a second isolation structure 170 (region where the dielectric material 132 filled in the previously-described trench openings 130) is located between two memory cells MC1 that are adjacent along the trench direction (e.g., the Y direction). The first isolation structure 150 electrically isolates and physically separates the pair of conductive structures 160 from each other in each memory cell MC1. On the other hand, the second isolation structure 170 electrically isolates and physically separates the adjacent memory cells MC1 from each other. Owing to the first isolation structure 150 and the second isolation structure 170, the cross-talking among the neighboring transistors located vertically and horizontally are greatly suppressed, thereby the reliability of electrical performance of the transistors is ensured.

In some embodiments, a portion of the conductive layer 120 in each stack 1041 and closest portions of the memory layer 108, the semiconductor layer 110 and the conductive structures 160 laterally adjacent to this portion of the conductive layer 120 constitute the transistor, e.g., a field effect transistor (FET), of each memory cell MC1 included in the 3D memory array 10. In those embodiments where the memory layer 108 is formed of a ferroelectric material, dipole moments in opposite directions can be stored in the memory layer 108. Accordingly, the FET has different threshold voltages in corresponding to the dipole moments, thus the FET can be identified as having different logic states. In these embodiments, the memory cell MC1 includes ferroelectric FETs. On the other hand, in those embodiments where the memory layer 108 is a charge trap layer, charges may be stored in the memory layer 108, thus the FET may have different threshold voltages depending on the amount of charge stored in the memory layer 108. Accordingly, the FET can be identified as having different logic states as well. In these embodiments, the memory cell MC1 includes charge trap flash (CTF) transistors.

Figures 19A, 19B:
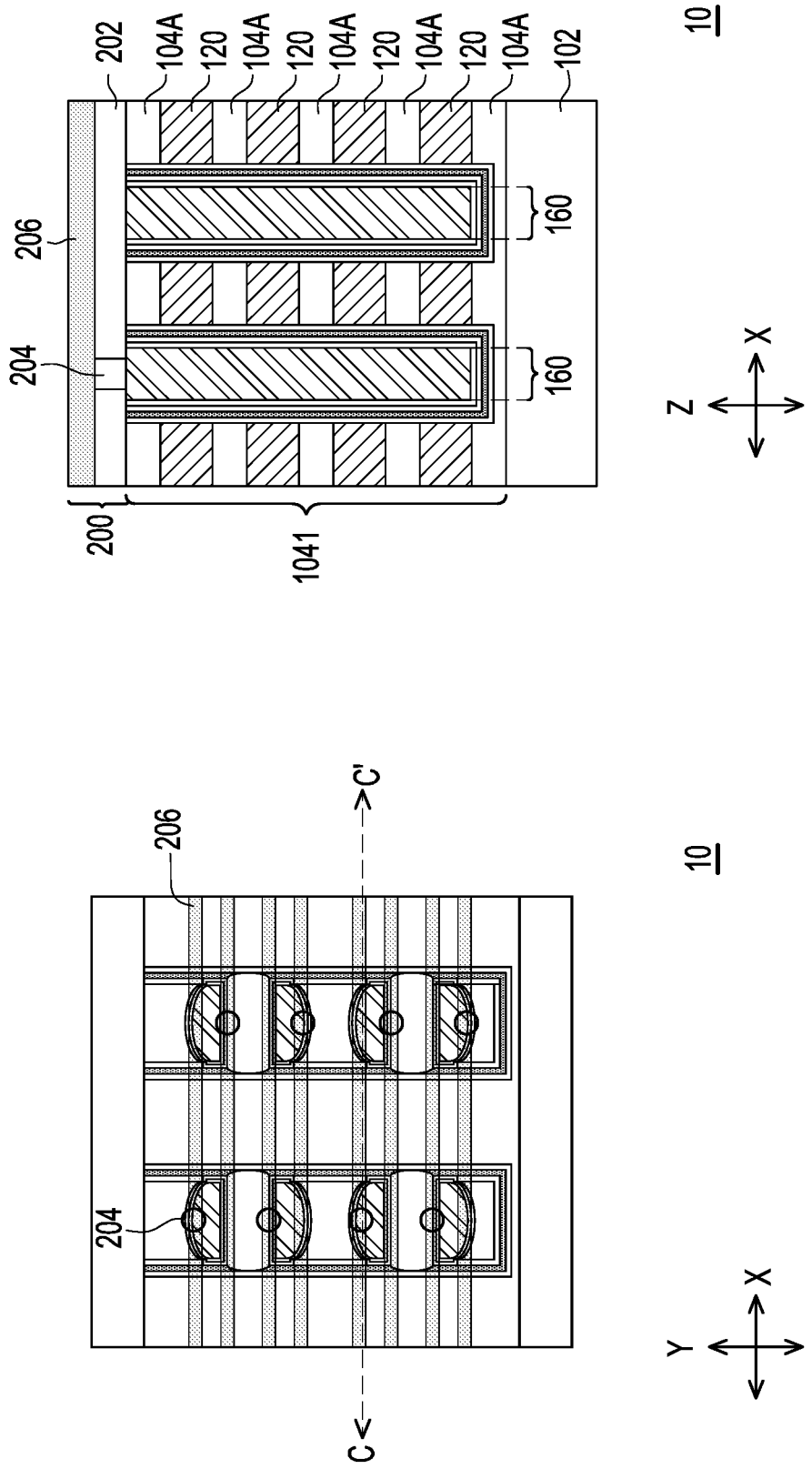

Referring to FIG. 19A and FIG. 19B, in some embodiments, the 3D memory array 10 further includes an interconnect structure 200 that is formed thereon. In some embodiments, the interconnect structure 200 includes conductive vias 204 and metal lines 206 (e.g., bit lines/source lines) embedded in a dielectric layer 202. In some embodiments, each metal line 206 is electrically connected to either one of the conductive structures 160 each through the respective conductive via 204. In some embodiments, the metal lines 206 extend along lateral direction (e.g., the X direction) intersected with trench direction (e.g., the Y direction).

As illustrated in FIG. 19A, each conductive structure 160 respectively connects to a respective one of metal lines 206; however, the disclosure is not limited thereto. As shown in cross-sectional view of FIG. 19B, in some embodiments, the metal lines 206 extend above the stacks 1041. The metal lines 206 and the conductive vias 204 may be formed concurrent with a formation of a back-end-of-the-line (BEOL) metal layer, for example. The direct contact of the conductive vias 204 and the conductive structures 160 establishes electrical connection from the conductive structures 160 to the overlying metal lines 206. It is understood that the interconnect structure 200 may include one or more of the conductive vias 204 and the metal lines 206 depending on design requirements of the 3D memory array 10.

In accordance with the embodiments of the present disclosure, the 3D memory array 10 includes an array of ferroelectric field-effect transistors (FeFETs). It is understood that additional processes or steps can be performed before, during, and after the manufacturing method/process described in the embodiments, and some of the process steps described in the previous embodiments may be omitted, repeated or replaced, and the sequence of the process steps may be adjusted as additional embodiments of the methods. It is further understood that additional structural features, components or devices may be formed in the 3D memory array 10, and some of the features described in the previous embodiments may be modified, replaced or omitted as for additional embodiments of the 3D memory array 10.

Figure 20:
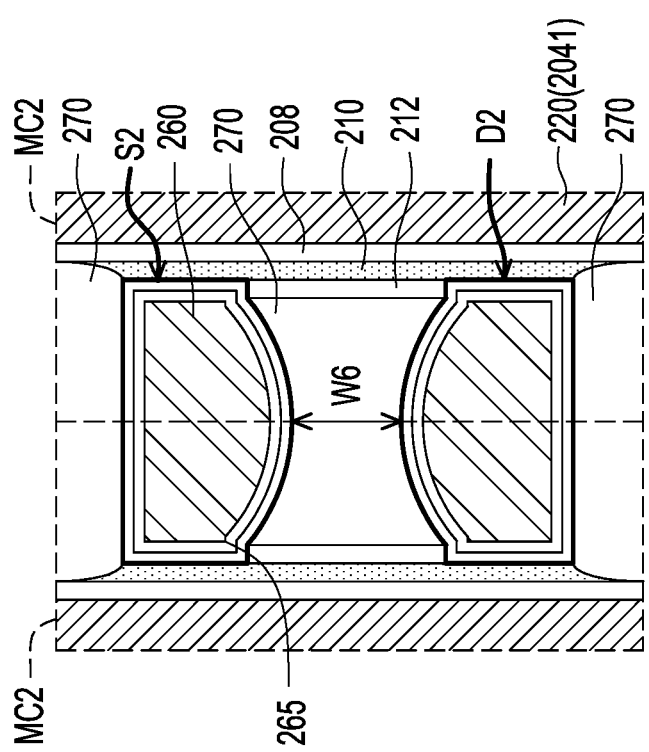
FIG. 20 is a schematic plan view illustrating a portion of a 3D memory array in accordance with some embodiments of the disclosure.

FIG. 20 is a schematic enlarged plan view of a portion of a 3D memory array 20 in accordance with some embodiments of the disclosure. In some embodiments, the 3D memory array 20 is formed using the processes as described in FIG. 1A through FIG. 19B. As illustrated in FIG. 20, the portion of the 3D memory array 20 includes a pair of source electrode S2 and drain electrode D2 that are separated from each other by an isolation structure 250. As depicted in FIG. 20, each of the pair of source electrode S2 and drain electrode D2 includes a conductive structure 260 and a liner layer structure surrounding the conductive structure 260. In addition, for the pair of source electrode S2 and drain electrode D2, each includes a curved sidewall facing each other and straight sidewalls facing away. As seen in FIG. 20, the isolation structure 250 therebetween has two opposing curved sidewalls (with a top view shape of a double concave lens), and the isolation structure 250 has a narrowest width W6 in the middle of the structure and a widest width at outermost parts. The isolation structures 270 for defining the memory cells are respectively disposed beside the straight sidewalls of the source electrode S2 and drain electrode D2. In some embodiments, each of the source electrode S2 and drain electrode D2 further includes a pair of kink portions 265 on opposite sides of each electrode S2/D2. In the disclosure, the kink portion 265 may refer to a portion of the conductive pillar 260 filled in the extended trench portion and at a region where the curve sidewall meets the straight sidewalls (at short sides) and further be referred to as an angled portion with an obtuse angle. As shown in FIG. 20, the two opposing kink portions 265 are connected to each other with the corresponding curved sidewall.

As shown in FIG. 20, a pair of capping layers 212 is disposed on opposite sidewalls of the isolation structure 250, and a pair of semiconductor layers 210 is disposed alongside the pair of capping layers 212 and extends between the pair of source electrode S2 and drain electrode D2. Further, a pair of memory layers 208 extends alongside the pair of semiconductor layers 210 and the isolation structures 270. In other words, the pair of memory layers 208 extends beyond the pair of source electrode S2 and drain electrode D2. Each one of the pair of memory layers 208 is separated from the conductive structures 260 by a respective one of the pair of semiconductor layers 210. In some embodiments, a narrowest width W6 of the isolation structure 250 may be considered as the nearest spacing between source electrode S2 and drain electrode D2.

The portion of 3D memory array 20 shown in FIG. 20 includes two neighboring memory cell MC2, in accordance with some embodiments of the present disclosure. Accordingly, each memory cell MC2 at least includes portions of the source electrode S2 and the drain electrode D2, a portion of the isolation structure 250, a stack including the capping layer 212, the semiconductor layer 210 and the memory layer 208 sequentially disposed beside the portions of the source electrode S2 and the drain electrode D2 and the portion of the isolation structure 250, as well as a conductive layer 220 (i.e., gate layer) of a stack 2041 adjacent to the memory layer 208. In other words, each memory cell MC2 may include the source electrode S2 and the drain electrode D2 with the kink portions 265 located at two opposite sides of the isolation structure 250 with opposing curved sidewalls, and both ends of the capping layer 212 are in contact with the kink portions 265.

Figure 21:
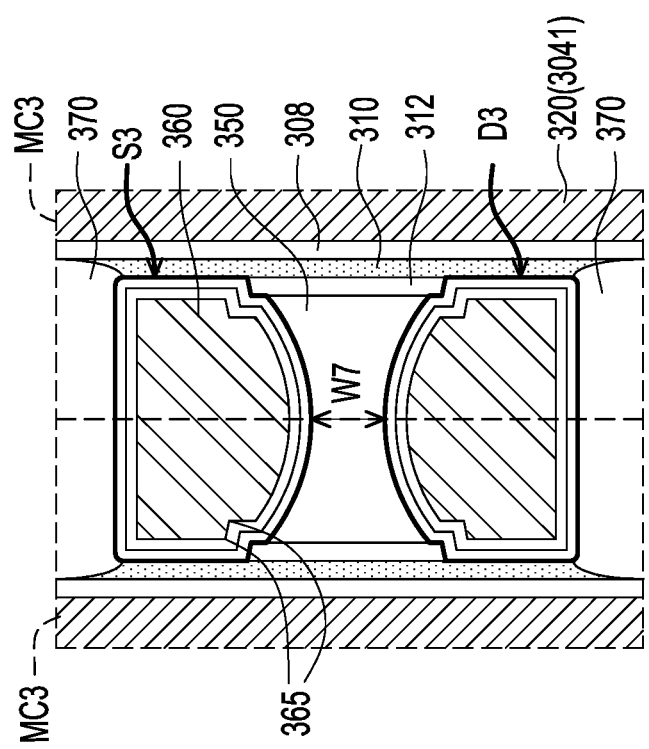
FIG. 21 is a schematic plan view illustrating a portion of a 3D memory array in accordance with some embodiments of the disclosure.

FIG. 21 is a schematic enlarged plan view illustrating a portion of a 3D memory array 30 in accordance with some embodiments of the disclosure. The portion of the 3D memory array 30 shown in FIG. 21 is similar to the portion of the 3D memory array 20 as described with reference to FIG. 20. Only differences therebetween will be described, the same or the like part would not be repeated again.

In some embodiments, the 3D memory array 30 is formed using similar methods or process steps used to form the 3D memory array 10 or 20 with process variations. As illustrated in FIG. 21, the portion of the 3D memory array 30 includes a pair of source electrode S3 and drain electrode D3 that are separated from each other by an isolation structure 350. As depicted in FIG. 21, the pair of source electrode S3 and drain electrode D3 each includes a conductive structure 360 and a liner layer surrounding the conductive structure 360. In some embodiments, the isolation structure 350 includes an hourglass top-view shape. The pair of source electrode S3 and drain electrode D3 each includes a curved sidewall facing to each other and a straight sidewall opposing to the curved sidewall. As shown in FIG. 21, isolation structures 370 are respectively disposed beside the straight sidewalls of the source electrode S3 and drain electrode D3. In addition, two multilayered stacks each including a capping layer 312, a semiconductor layer 310 and a memory layer 308 are disposed on opposite sidewalls of the isolation structure 350, and each multilayered stack may be similar to the multilayered stack of the memory cell MC2 as described with reference to FIG. 20. In some embodiments, a length of each capping layer 312 is larger than a length of the sidewall of the isolation structure 350.

For example, the main difference between the 3D memory array 30 and the 3D memory array 20 lies in that profiles (e.g. top-view shapes) of the source electrode S3 are different from those of the source electrode S2, and profiles (e.g. top-view shapes) of the drain electrode D3 are different from those of the drain electrode D2. For example, each of the source electrode S3 and drain electrode D3 includes kink portions 365 on opposite sides thereof. As shown in FIG. 21, the kink portions 365 of the same electrode are connected through the corresponding curved sidewall therebetween. In some embodiments, following the formation of the extended trench portions E1/E2 (see FIG. 16A), over-etching may occur to further enlarge the semi-trench openings P1/P2 and further etch into the isolation structure(s) 250/270, so that the subsequently formed electrode through holes for accommodating the source electrode S3 and drain electrode D3 become larger and the later formed source electrode S3 and drain electrode D3 become larger in sizes. As seen FIG. 21, in some embodiments, due to the further enlarged openings, the kin portion 365 may include double folds or two obtuse angled parts. That is, compared with the isolation structure (s) 250 between the source electrode S2 and drain electrode D2 as seen in FIG. 20, the narrowest width W7 of the isolation structure 350 is smaller than the width W6 of the isolation structure 250 described with reference to FIG. 20. This may further increase the overall cross-sectional areas of the conductive pillars 360 and 380, and the impedance of the memory cells can be reduced.

Similarly, the portion of 3D memory array 30 shown in FIG. 21 includes two neighboring memory cell MC3, in accordance with some embodiments of the present disclosure. Accordingly, each memory cell MC3 at least includes portions of the source electrode S3 and drain electrode D3, a portion of the isolation structure 350, the multilayered stack including the capping layer 312, the semiconductor layer 310 and the memory layer 308 sequentially disposed beside the portions of the source electrode S3 and drain electrode D3 and the portion of the isolation structure 350, as well as a conductive layer 320 (i.e., gate layer) of a stack 3041 adjacent to the memory layer 308. In other words, each memory cell MC3 may include the portion of the isolation structure 350 sandwiched between the source electrode S3 and the drain electrode D3 with kink portions 365, and both ends of the capping layer 312 are in contact with the kink portions 365.

In accordance with an embodiment of the disclosure, a memory cell is described. The memory cell includes a first isolation structure, source and drain electrodes, a gate layer, a channel layer and a memory layer. The source and drain electrodes are disposed on opposite sides of the first isolation structure, and the source and drain electrodes comprise kink portions. The gate layer is disposed beside the source and drain electrodes and the first isolation structure. The channel layer is disposed by the source electrode, the first isolation structure and the drain electrode and disposed between the gate layer and the source electrode, the first isolation structure and the drain electrode, wherein the channel layer extends between the source and drain electrodes and covers the kink portions of the source and drain electrodes. The memory layer is disposed next to the gate layer and disposed between the gate layer and the channel layer, and the memory layer extends beside the gate layer and extends beyond the channel layer.

In accordance with another embodiment of the disclosure, a memory array is described. The memory array includes a stack structure, ferroelectric layers, pairs of conductive pillars, and semiconductor layers. The stack structure comprises horizontal metal layers and horizontal dielectric layers stacked in alternation. The ferroelectric layers are disposed within the stack structure and vertically extending through the horizontal metal layers and the horizontal dielectric layers, and each ferroelectric layer includes a ring-shaped wall structure. The pairs of conductive pillars are vertically disposed within the stack structure and located within the ring-shaped wall structures of the ferroelectric layers, wherein each conductive pillar of the pairs of conductive pillars has a pair of angled portions and a curved sidewall connecting the pair of angled portions. The semiconductor layers are vertically disposed within the stack structure and located within the ring-shaped wall structures of the ferroelectric layers and located between the pairs of conductive pillars and the ferroelectric layers, wherein each semiconductor layer extends between a pair of the pairs of conductive pillars to laterally cover two angled portions of the pair, and the curved sidewalls of the pair face each other.

In accordance with yet another embodiment of the disclosure, a method of manufacturing a memory array is described. The method includes at least the following steps. A multilayered structure comprising conductive layers and dielectric layers in alternation is formed. First trench openings extending into the multilayered structure are formed, wherein the first trench openings are formed into a strip shape from a top view. A memory layer, a semiconductor layer and a capping layer are formed within the first trench openings to conformally cover the first trench openings. A dielectric material is deposited to fill up the first trench openings. A plurality of second trench openings is formed within each first trench opening, wherein the capping layers are exposed from the plurality of second trench openings. First isolation structures are formed within the first trench openings and extending into the multilayered structure, wherein the first isolation structures are formed in the plurality of second trench openings to divide each of the plurality of second trench openings into a pair of semi-trench openings. The capping layers located beside the pairs of semi-trench openings are removed to form electrode through-holes. A conductive material is filled into the electrode through-holes to form conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
   a first isolation structure;
   source and drain electrodes, disposed on opposite sides of the first isolation structure, wherein the source and drain electrodes comprise kink portions;
   a gate layer disposed beside the source and drain electrodes and the first isolation structure;
   a channel layer, disposed by the source electrode, the first isolation structure and the drain electrode and disposed between the gate layer and the source electrode, the first isolation structure and the drain electrode, wherein the channel layer extends between the source and drain electrodes and covers the kink portions of the source and drain electrodes; and
   a memory layer, disposed next to the gate layer and disposed between the gate layer and the channel layer, wherein the memory layer extends beside the gate layer and extends beyond the channel layer.

2. The memory cell of claim 1, wherein the gate layer is in direct contact with the memory layer, and the channel layer is in direct contact with the source and drain electrodes.

3. The memory cell of claim 1, wherein the opposite sides of the first isolation structure have curved sidewalls opposed to each other, and the source and drain electrodes have curved sidewalls facing the curved sidewalls of the first isolation structure.

4. The memory cell of claim 3, further comprising second isolation structures disposed beside sidewalls of the source and drain electrodes that are opposite to the curved sidewalls.

5. The memory cell of claim 1, further comprising a capping layer disposed beside the channel layer and extending between the source and drain electrodes, wherein the capping layer is located between the kink portions of the source and drain electrodes.

6. The memory cell of claim 1, wherein the source and drain electrodes each includes a conductive structure and a liner structure conformally surrounded the conductive structure.

7. The memory cell of claim 1, wherein the memory layer includes a ferroelectric material.

8. A memory array comprising:
   a stack structure comprising horizontal metal layers and horizontal dielectric layers stacked in alternation;
   ferroelectric layers, disposed within the stack structure and vertically extending through the horizontal metal layers and the horizontal dielectric layers, wherein each ferroelectric layer includes a ring-shaped wall structure;
   pairs of conductive pillars, vertically disposed within the stack structure and located within the ring-shaped wall structures of the ferroelectric layers, wherein each conductive pillar of the pairs of conductive pillars has a pair of angled portions and a curved sidewall connecting the pair of angled portions; and
   semiconductor layers, vertically disposed within the stack structure and located within the ring-shaped wall structures of the ferroelectric layers and located between the pairs of conductive pillars and the ferroelectric layers, wherein each semiconductor layer extends between a pair of the pairs of conductive pillars to laterally cover two angled portions of the pair, and the curved sidewalls of the pair face each other.

9. The memory array of claim 8, further comprising a first dielectric structure disposed between the pair of the pairs of conductive pillars.

10. The memory array of claim 9, further comprising capping layers disposed between the pair of the pairs of conductive pillars and disposed on opposite sidewalls of the first dielectric structure.

11. The memory array of claim 10, wherein the capping layers fully cover the opposite sidewalls of the first dielectric structure.

12. The memory array of claim 10, wherein the capping layers extend beyond the opposite sidewalls of the first dielectric structure.

13. The memory array of claim 8, further comprising a second dielectric structure disposed between two adjacent pairs of the pairs of conductive pillars, and the second dielectric structure is in direct contact with the ferroelectric layers.

14. The memory array of claim 8, further comprising a liner stack conformally wrapping each conductive pillar of the pairs of the conductive pillars, wherein the liner stack comprises a barrier layer and a glue layer.

15. A method of manufacturing a memory array comprising:
    forming a stack structure comprising horizontal metal layers and horizontal dielectric layers stacked in alternation;
    forming ferroelectric layers within the stack structure, wherein the ferroelectric layers vertically extend through the horizontal metal layers and the horizontal dielectric layers, and each ferroelectric layer includes a ring-shaped wall structure;
    forming pairs of conductive pillars vertically within the stack structure, wherein the pairs of conductive pillars are located within the ring-shaped wall structures of the ferroelectric layers, and each conductive pillar of the pairs of conductive pillars has a pair of angled portions and a curved sidewall connecting the pair of angled portions; and
    forming semiconductor layers vertically within the stack structure, wherein the semiconductor layers are located within the ring-shaped wall structures of the ferroelectric layers and located between the pairs of conductive pillars and the ferroelectric layers, wherein each semiconductor layer extends between a pair of the pairs of conductive pillars to laterally cover two angled portions of the pair, and the curved sidewalls of the pair face each other.

16. The method of claim 15, further comprising forming a first dielectric structure between the pair of the pairs of conductive pillars.

17. The method of claim 16, further comprising forming capping layers between the pair of the pairs of conductive pillars and disposed on opposite sidewalls of the first dielectric structure.

18. The method of claim 17,
    wherein the capping layers fully cover the opposite sidewalls of the first dielectric structure.

19. The method of claim 17,
    wherein the capping layers extend beyond the opposite sidewalls of the first dielectric structure.

20. The method of claim 15, further comprising forming a second dielectric structure between two adjacent pairs of the pairs of conductive pillars, wherein the second dielectric structure is in direct contact with the ferroelectric layers.

* * * * *